(12) United States Patent
Tan

(10) Patent No.: US 10,811,351 B2
(45) Date of Patent: Oct. 20, 2020

(54) PREFORMED INTERLAYER CONNECTIONS FOR INTEGRATED CIRCUIT DEVICES

(71) Applicant: Intel Corporation, Santa Clara, CA (US)

(72) Inventor: Elliot N. Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/316,528

(22) PCT Filed: Sep. 26, 2016

(86) PCT No.: PCT/US2016/053830
§ 371 (c)(1),
(2) Date: Jan. 9, 2019

(87) PCT Pub. No.: WO2018/057042
PCT Pub. Date: Mar. 29, 2018

(65) Prior Publication Data
US 2019/0295943 A1    Sep. 26, 2019

(51) Int. Cl.
*H01L 23/522* (2006.01)
*H01L 21/768* (2006.01)
*H01L 23/498* (2006.01)

(52) U.S. Cl.
CPC .... *H01L 23/5226* (2013.01); *H01L 21/76801* (2013.01); *H01L 21/76807* (2013.01);
(Continued)

(58) Field of Classification Search
CPC ........... H01L 23/5226; H01L 23/49827; H01L 23/49822; H01L 21/76897;
(Continued)

(56) References Cited

U.S. PATENT DOCUMENTS 9,362,165 B1    6/2016  Bouche et al.
2005/0221604 A1  10/2005  He et al.
(Continued)

OTHER PUBLICATIONS

International Search Report and Written Opinion for International Patent Application No. PCT/US2016/053830 dated Jun. 26, 2017, 13 pgs.

*Primary Examiner* — Jasmine J Clark
(74) *Attorney, Agent, or Firm* — Schwabe, Williamson & Wyatt, P.C.

(57) ABSTRACT

A first metallization layer is deposited on a first insulating layer on a substrate. The first metallization layer comprises a set of first conductive lines. A second metallization layer is deposited over the first metallization layer. The second metallization layer comprises a set of second conductive lines that cross the set of first conductive lines to form intersection regions. At least one of the intersection regions comprises a first portion of one of the first conductive lines and a second portion of one of the second conductive lines that crosses the first portion. A plurality of preformed connections are disposed between the first metallization layer and the second metallization layer at the plurality of intersection region. At least one of the preformed connections comprises a second insulating layer aligned to the second portion and the first portion.

20 Claims, 15 Drawing Sheets

(52) U.S. Cl.
CPC .. *H01L 21/76816* (2013.01); *H01L 21/76843* (2013.01); *H01L 21/76897* (2013.01); *H01L 21/76834* (2013.01); *H01L 21/76883* (2013.01); *H01L 23/49822* (2013.01); *H01L 23/49827* (2013.01)

(58) Field of Classification Search
CPC ......... H01L 21/76801; H01L 21/76807; H01L 21/76834; H01L 21/76883; H01L 21/76843; H01L 21/76816; H01L 21/76898; H01L 21/76885; H01L 23/76883
See application file for complete search history.

(56) References Cited

U.S. PATENT DOCUMENTS

| | | | |
|---|---|---|---|
| 2009/0162998 A1* | 6/2009 | Lee | B82Y 10/00 438/478 |
| 2014/0210098 A1 | 7/2014 | Jezewski et al. | |
| 2016/0086884 A1 | 3/2016 | O'Brien et al. | |
| 2016/0197011 A1 | 7/2016 | Bristol et al. | |

* cited by examiner

100

200

300

400

PREFORMED INTERLAYER CONNECTIONS FOR INTEGRATED CIRCUIT DEVICES

CROSS-REFERENCE TO RELATED APPLICATION

This patent application is a U.S. National Phase Application under 35 U.S.C. § 371 of International Application No. PCT/US2016/053830, filed Sep. 26, 2016, entitled "PREFORMED INTERLAYER CONNECTIONS FOR INTEGRATED CIRCUIT DEVICES," which designates the United States of America, the entire disclosure of which is hereby incorporated by reference in its entirety and for all purposes.

FIELD

Embodiments as described herein relate to a field of electronic device manufacturing, and in particular, to an integrated circuit (IC) manufacturing.

BACKGROUND

Generally, an integrated circuit (IC) refers to a set of electronic devices, e.g., transistors formed on a small chip of semiconductor material, typically, silicon. Typically, an interconnect structure incorporated into the IC includes one or more levels of metal lines to connect the electronic devices of the IC to one another and to external connections. An interlayer dielectric is placed between the metal levels of the IC for insulation.

Typically, to manufacture an interconnect structure, a planar process is used that involves aligning and connecting one layer of metallization to another layer of metallization. As the size of the IC decreases, the spacing between the metal lines decreases. Conventional techniques of manufacturing interconnect structures in a nanoscale regime, however, cannot provide robust edge placement accuracy for interlayer connection.

One of conventional techniques to manufacture an interconnect structure involves encapsulating every other metal line of one metallization layer with a hard mask of one material and encapsulating the interleaving set of the metal lines of another metallization layer with a hard mask of another material to prevent a misaligned via shorting to the adjacent metal line by virtue of the etch contrast of the two materials. However, the complex process flow and the multiple lithography masks required for the conventional techniques significantly increases the manufacturing cost.

BRIEF DESCRIPTION OF THE DRAWINGS

Embodiments of the invention may be best understood by referring to the following description and accompanying drawings that are used to illustrate embodiments of the invention.

In the drawings.

DETAILED DESCRIPTION

Figure 1:
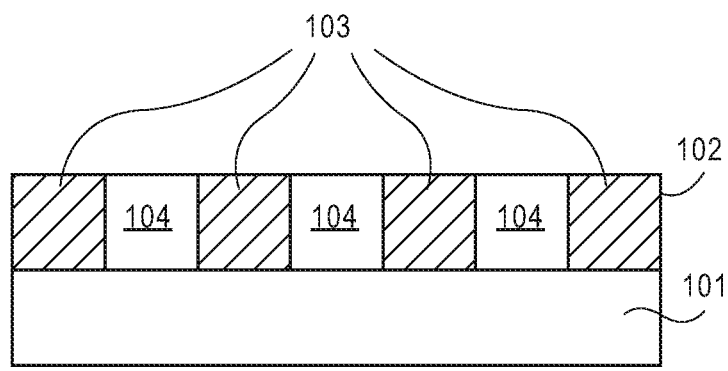
FIG. 1 is a view of an electronic device structure to provide preformed interlayer connections according to one embodiment.

Methods and apparatuses to provide preformed interlayer connections for integrated circuit devices are described. In one embodiment, a first metallization layer is deposited on a first insulating layer on a substrate. The first metallization layer comprises a set of first conductive lines. A second metallization layer is deposited over the first metallization layer. The second metallization layer comprises a set of second conductive lines that cross the set of first conductive lines to form intersection regions. At least one of the intersection regions comprises a first portion of one of the first conductive lines and a second portion of one of the second conductive lines that crosses the first portion. A plurality of preformed connections are disposed between the first metallization layer and the second metallization layer at the plurality of intersection region. At least one of the preformed connections comprises a second insulating layer aligned to the second portion and the first portion.

In one embodiment, preformed cross-point connections between two orthogonal metallization layers are created at the intersection regions of the metal lines of the metallization layers. At least one of the preformed connection is activated using a lithography and a damascene process. The preformed cross-point connections are formed by depositing a sacrificial grating layer on the underlying metal layer having a top encapsulated with an insulating material. The exposed encapsulating material is removed using a directional dry etch. The residual encapsulation screened by the grating forms a preformed connection between the grating and the orthogonal underlying metal. The inversion of the grating pattern uncovers all the preformed (dummy) connectors for selection by lithography. The insulating material in the selected dummy connectors is then removed by an isotropic etch. Any of edge placement errors may prevent the selected dummy connector from being fully uncovered, however an undercut action of the isotropic etch completely removes the insulating material and creates a perfect connection after metallization, as described in further detail below.

In one embodiment, preformed line ends are created by encapsulating the underlying mesa dielectric with another insulating material. The inversion of the grating pattern uncovers a set of dummy connectors and dummy line ends. A sequence of lithography and an isotropic etch removes the unwanted line ends to create a final circuit pattern. The integrated circuit having the preformed interlayer connections provides the vias self-aligned to the line ends and to both the metal lines above and below, as described in further detail below.

Embodiments of the invention as described herein are beneficial in terms of mask costs and process efficiency relative to the conventional techniques that use coloring schemes. Additionally, embodiments of the invention as described herein suppress any critical dimension (CD) variation by having the vias defined by the grating in one direction and the underlying metal in the orthogonal direction. Embodiments of the invention as described herein use a simple top-down approach that is capable of achieving perfect interlayer alignment without deploying novel but unproven techniques, e.g., selective growth and directed self-assembly techniques.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1 is a view 100 of an electronic device structure to provide preformed interlayer connections according to one embodiment. A lower metallization layer (M-)102 comprising a set of conductive lines 103 is deposited on an insulating layer 104 on a substrate 101, as shown in FIG. 1. In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In yet another embodiment, substrate 101 is an amorphous silicon substrate. In alternative embodiments, substrate 101 includes a group IV material (e.g., silicon (Si), carbon (C), germanium (Ge), silicon germanium (SiGe), other group IV material), a III-V material (e.g., gallium arsenide (GaAs), InP, GaAs, InGaAs, InAlAs, other III-V material), or any combination thereof.

In an embodiment, substrate 101 is a semiconductor-on-insulator (SOI) substrate including a bulk lower substrate, a middle insulation layer, and a top monocrystalline layer. The top monocrystalline layer may comprise any material listed above, e.g., silicon. In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 101 and one or more layers above substrate 101 and to confine lattice dislocations and defects.

Insulating layer 104 can be any material suitable to insulate adjacent devices and prevent leakage. In one embodiment, electrically insulating layer 104 is an oxide layer, e.g., silicon dioxide, or any other electrically insulating layer determined by an electronic device design. In one embodiment, insulating layer 104 comprises an interlayer dielectric (ILD). In one embodiment, insulating layer 104 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 104 includes a dielectric material having k-value less than 5. In one embodiment, insulating layer 104 includes a dielectric material having k-value less than 2. In at least some embodiments, insulating layer 104 includes a nitride, oxide, a polymer, phosphosilicate glass, fluorosilicate (SiOF) glass, organosilicate glass (SiOCH), other electrically insulating layer determined by an electronic device design, or any combination thereof. In at least some embodiments, insulating layer 104 may include polyimide, epoxy, photodefinable materials, such as benzocyclobutene (BCB), and WPR-series materials, or spin-on-glass.

In one embodiment, insulating layer 104 is a shallow trench isolation (STI) layer to provide field isolation regions that isolate one metal line from other metal lines on substrate 101. In one embodiment, the thickness of the layer is in an approximate range from about 10 nm to about 2 microns (μm).

In an embodiment, insulating layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, metallization layer 102 comprising metal lines 103 is a part of a back end metallization of the electronic device. In one embodiment, a hard mask (not shown) is deposited on insulating layer 104. In one embodiment, the insulating layer 104 is patterned and etched using the hard mask to form trenches using one or more patterning and etching techniques known to one of ordinary skill in the art of microelectronic device manufacturing. In one embodiment, the size of trenches in the insulating layer 104 is determined by the size of conductive lines formed later on in a process.

In one embodiment, forming the conductive lines 103 involves filling the trenches in the insulating with a layer of conductive material. In one embodiment, a base layer (not shown) is first deposited on the internal sidewalls and bottom of the trenches, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 104. Additionally, the conductive barrier layer can be used to provide adhesion for the seed layer (e.g., copper).

In one embodiment, to form the base layer, the conductive barrier layer is deposited onto the sidewalls and bottom of the trenches in the insulating layer 104, and then the seed layer is deposited on the conductive barrier layer. In another embodiment, the conductive base layer includes the seed layer that is directly deposited onto the sidewalls and bottom of the trenches in the insulating layer 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nanometers (nm) to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base layer of copper, by an electroplating process. In one embodiment, the conductive layer is deposited into the trenches in the insulating layer 104 using a damascene process known to one of ordinary skill in the art of microelectronic device manufacturing. In one embodiment, the conductive layer is deposited onto the seed layer in the trenches in the insulating layer 104 using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 103 determines the choice of a material for the seed layer. For example, if the material for the conductive lines 103 includes copper, the material for the seed layer also includes copper. In one embodiment, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, indium (In), tin (Sn), lead (Pb), antimony (Sb), bismuth (Bi), zinc (Zn), cadmium (Cd), or any combination thereof.

In alternative embodiments, examples of the conductive materials that may be used for the metallization layer 102 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 103 with top portions of the insulating layer 104 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 20 nm to about 40 nm.

In an embodiment, the metallization layer 102 is configured to connect to other metallization layers (not shown). In an embodiment, metallization layer 102 is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2:
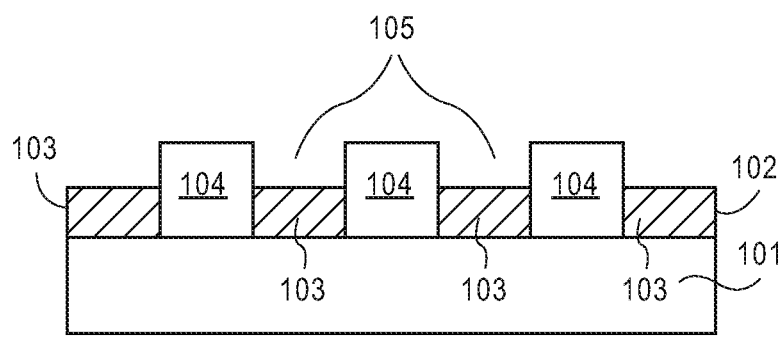
FIG. 2 is a view similar to FIG. 1, after the conductive lines are recessed according to one embodiment.

FIG. 2 is a view 200 similar to FIG. 1, after the conductive lines 103 are recessed according to one embodiment. As shown in FIG. 2, the conductive lines 103 are recessed to a predetermined depth to form trenches 104. Trenches 104 have sidewalls that are portions of insulating layer 104, and bottoms that are top surfaces of the conductive lines 103.

In one embodiment, the depth of the trenches 105 is from about 10 nm to about 500 nm. In one embodiment, the depth of the trenches 105 is from about 10% to about 100% of the thicknesses of the conductive lines. In more specific embodiment, the depth of the trenches 105 is from about 10% to about 100% of the thicknesses of the conductive lines. In one embodiment, the conductive lines 103 are recessed using one or more of wet etching, dry etching, or a combination thereof techniques known to one of ordinary skill in the art of electronic device manufacturing.

Figure 3A:
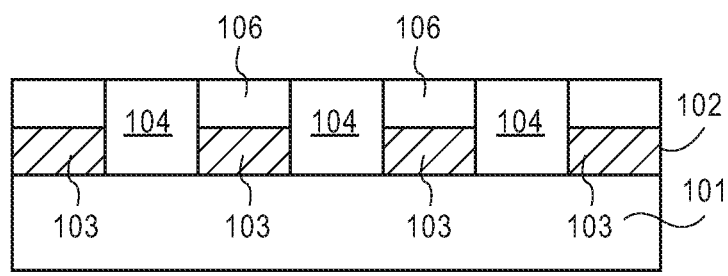
FIG. 3A is a view similar to FIG. 2, after an insulating layer is deposited on conductive lines according to one embodiment.
Figure 3B:
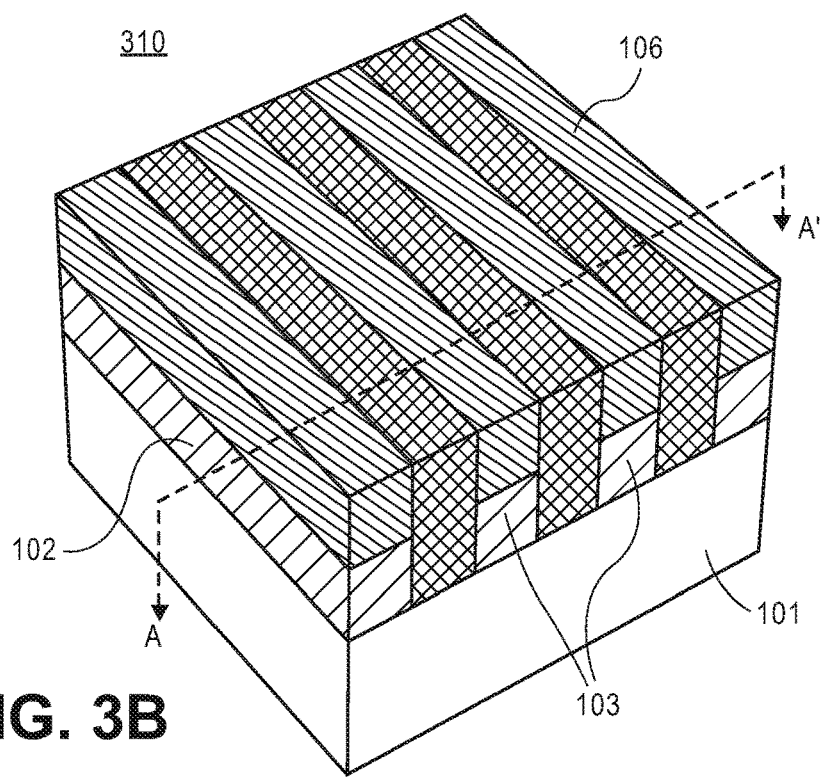
FIG. 3B is a perspective view of the electronic device structure depicted in FIG. 3A according to one embodiment.

FIG. 3A is a view 300 similar to FIG. 2, after an insulating layer 106 is deposited on conductive lines 103 within trenches 105 according to one embodiment. FIG. 3B is a perspective view 310 of the electronic device structure depicted in FIG. 3A according to one embodiment. FIG. 3A is a cross-sectional view of the electronic device structure illustrated in FIG. 3B along an axis A-A' according to one embodiment. As shown in FIGS. 3A and 3B, insulating layer 106 fills the trenches 105. Insulating layer 106 is deposited on the bottom and sidewalls of the trenches 105. In one embodiment, portions of the insulating layer 106 are removed to even out top portions of the insulating layer 106 with top portions of the insulating layer 104 using a CMP technique known to one of ordinary skill in the art of microelectronic device manufacturing.

In one embodiment, insulating layer 106 is different from the insulating layer 104. In one embodiment, insulating layer 106 is a hard mask layer. In one embodiment, the insulating layer 106 is etch selective to the insulating layer 104. Generally, etch selectivity between two materials is defined as the ratio between their etching rates at similar etching conditions. In one embodiment, the ratio of the etching rate of the insulating layer 106 to that of the insulating layer 104 is at least 5:1.

In one embodiment, the insulating layer 106 a silicon nitride, a silicon carbide, silicon nitride carbide, or any combination thereof. In alternate embodiments, insulating layer 106 is an oxide layer, e.g., a silicon oxide layer, a carbon doped oxide layer, e.g., a carbon doped silicon oxide layer, a silicon oxy carbide (SiOC) layer, a fluorine-doped silicon oxide, a metal oxide, e.g., a titanium oxide, an aluminum oxide, a hafnium oxide, or any other metal oxide; a hydrogensilesquioxane (HSQ), a fluorinated amorphous carbon, a methylsesquioxane (MSQ), a nitride layer, e.g., a silicon nitride, a titanium nitride, a silicon oxide nitride, silicon carbide, or other insulating layer.

In an embodiment, the insulating layer 106 is deposited using one of deposition techniques, such as but not limited to a CVD, PVD, MBE, MOCVD, ALD, spin-on, or other insulating layer deposition techniques known to one of ordinary skill in the art of microelectronic device manufacturing.

Figure 4A:
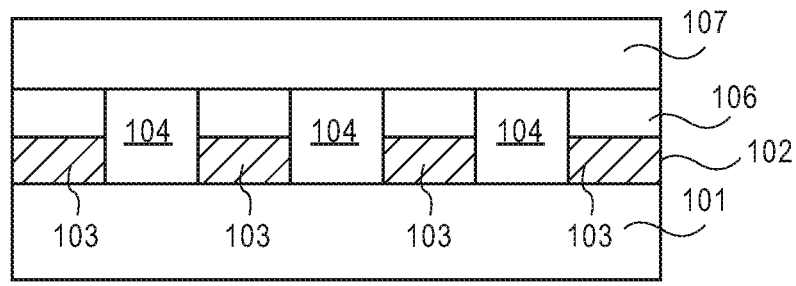
FIG. 4A is a view similar to FIG. 3A, after a grating layer is deposited on portions of the insulating layer according to one embodiment.
Figure 4B:
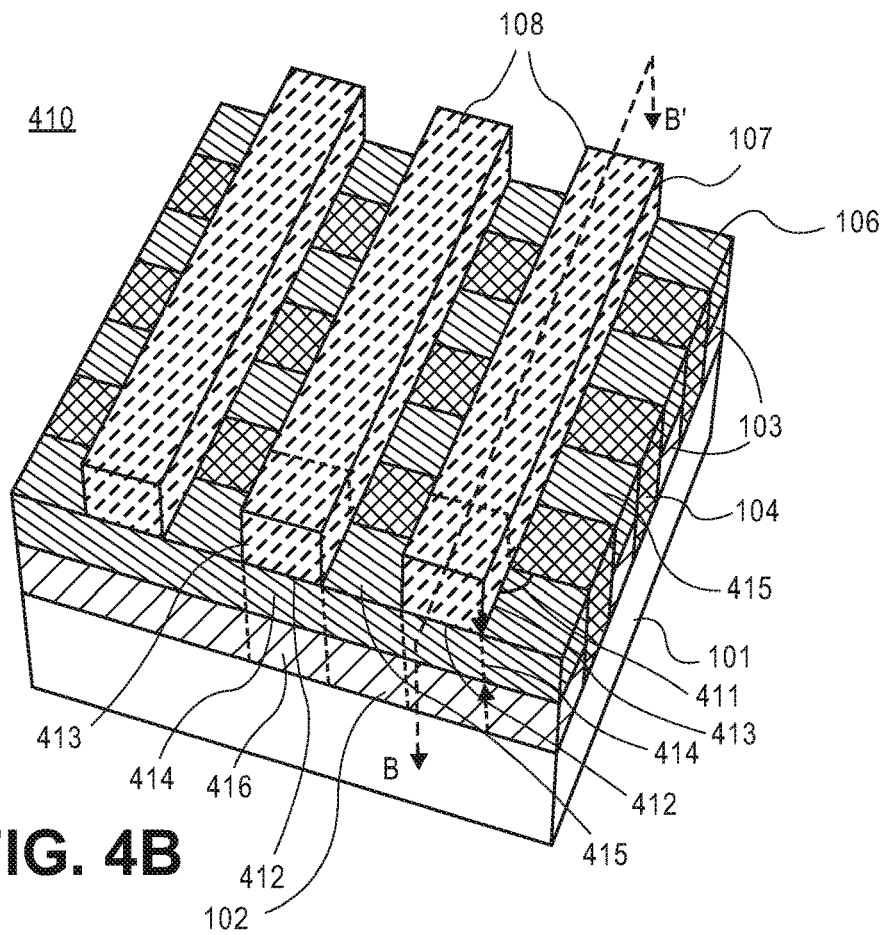
FIG. 4B is a perspective view of the electronic device structure depicted in FIG. 4A according to one embodiment.

FIG. 4A is a view 400 similar to FIG. 3A after a grating layer 107 is deposited on portions of the insulating layer 106 according to one embodiment. FIG. 4B is a perspective view 410 of the electronic device structure depicted in FIG. 4A according to one embodiment. FIG. 4A is a cross-sectional view of the electronic device structure illustrated in FIG. 4B along an axis B-B' according to one embodiment. As shown in FIGS. 4A and 4B, grating layer 107 comprises a set of grating lines 108 that are used as a grid to form conductive lines of an upper metallization layer later in a process. As shown in FIGS. 4A and 4B, grating lines 108 extend in a direction that is at an angle 411 relative to a direction of conductive lines 103. In one embodiment, angle 411 is about 90 degrees, so that grating lines 108 extend in a direction that is substantially orthogonal to the propagation direction of the conductive lines 103. As shown in FIG. 4B, the grating lines 108 cross the conductive lines 103 to form intersection regions 412. The intersection regions 412 comprise portions 413 of the conductive lines 103 on portions 414 of insulating layer 106 on portions 416 the conductive lines 103. As shown in FIGS. 4A and 4B, portions of the insulating layer, such as portions 415 are exposed by the grating lines 108.

In one embodiment, grating layer 107 comprises a material that is etch selective to the insulating layer 104 and the insulating layer 106. In one embodiment, the ratio of the etching rate of the grating layer 107 to that of the insulating layers 106 and 104 is at least 5:1.

In one embodiment, grating layer 107 is a semiconductor layer, e.g., silicon, germanium, or other semiconductor layer, a metal oxide layer, e.g., titanium oxide, aluminum oxide, other metal oxide layer, a metal nitride layer, e.g., a titanium nitride, aluminum nitride, other metal nitride layer, other material layer, or any combination thereof that is etch selective to the insulating layers 104 and 106. In one embodiment, grating layer 107 is a silicon layer, insulating layer 106 is a silicon nitride layer, and insulating layer 104 is a silicon oxide layer.

In one embodiment, the grating layer 107 is blanket deposited on the insulating layers 104 and 106. In one embodiment, a hard mask (not shown) is deposited on grating layer 107. In one embodiment, the grating layer 107 is patterned and etched using the hard mask to form grating lines 108 using one or more patterning and etching techniques known to one of ordinary skill in the art of microelectronic device manufacturing. In one embodiment, the grating layer 107 is deposited using one of deposition techniques, such as but not limited to a CVD, PVD, MBE, MOCVD, ALD, spin-on, or other deposition techniques known to one of ordinary skill in the art of microelectronic device manufacturing. In one embodiment, the dimensions of the grating lines 108 are similar to the dimensions of the conductive lines 103. In one embodiment, the pitch between the grating lines 108 is similar to that of the conductive lines 103.

Figure 5:
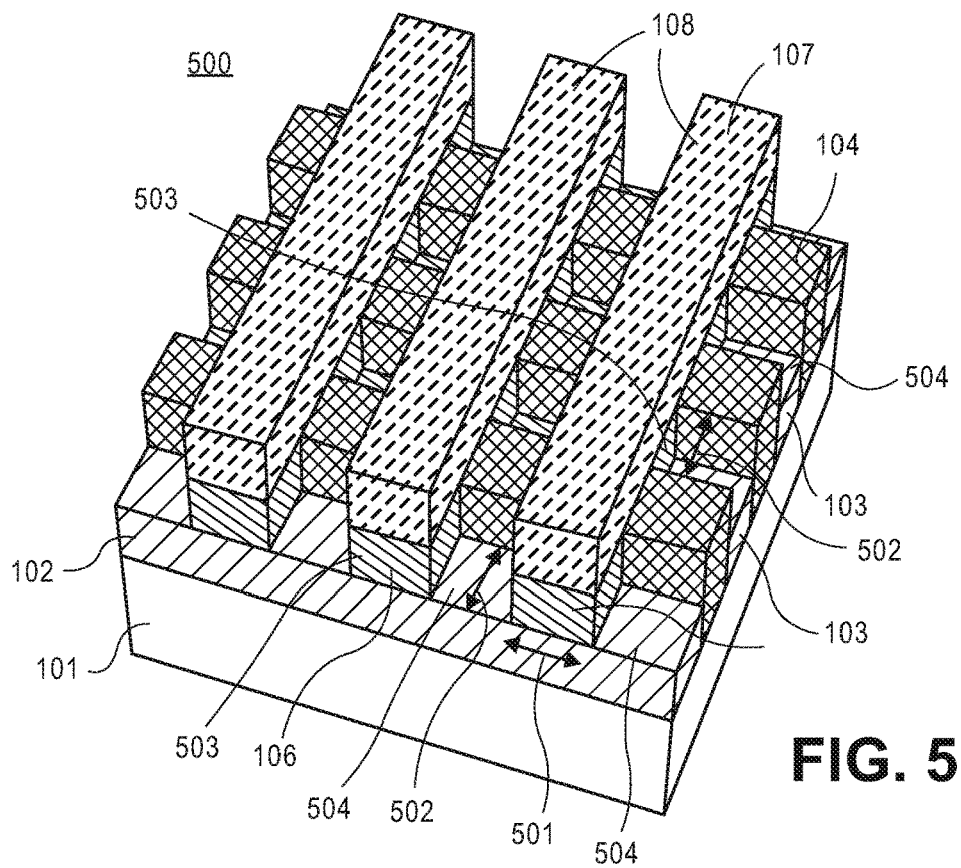
FIG. 5 is a view similar to FIG. 4B, after the exposed portions of the insulating layer are selectively removed using grating lines as a mask according to one embodiment.

FIG. 5 is a view 500 similar to FIG. 4B after the exposed portions of the insulating layer 106 are selectively removed using grating lines 108 as a mask according to one embodiment. The portions of the insulating layer 106 exposed by grating lines 108 are removed to expose top portions of the conductive lines 103 and side portions of the insulating layer 104. As shown in FIG. 5, preformed connections 503 are created on portions of conductive lines 103.

As shown in FIG. 5, the preformed connections 503 represent the portions 414 of insulating layer 106 between the portions 413 of the grid lines 108 and the portions 416 of the conductive lines 103. As shown in FIG. 5, the preformed connections 503 extend in a direction substantially orthogonal to the conductive lines 103 and grid lines 108. As shown in FIG. 5, the preformed connections 503 are aligned to the portions 413 of the grid lines 108 and portions 416 of the conductive lines 103.

In one embodiment, the exposed portions of the insulating layer 106 are removed selectively to insulating layer 104 by an isotropic wet etch chemistry comprising a phosphoric acid, or other acid. In one embodiment, the exposed portions of the insulating layer 106 are removed using one or more of selective wet etching, dry etching, or a combination thereof techniques known to one of ordinary skill in the art of electronic device manufacturing.

Each of the preformed connections 503 has a dimension 501 that corresponds to the width of the grating line 107 and a dimension 502 that corresponds to the pitch between the conductive lines 103. In one embodiment, the preformed connections 503 represent a grid indicating locations of all potential connection regions between lower metallization layer 102 and an upper metallization layer deposited thereon later on in a process.

Figure 6:
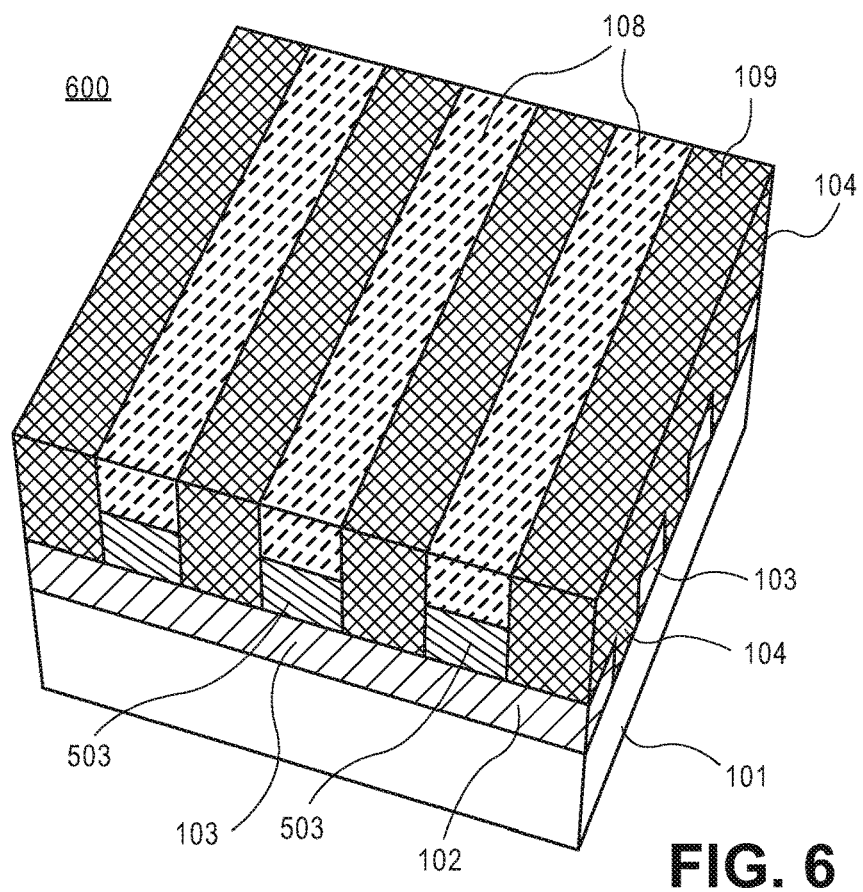
FIG. 6 is a view similar to FIG. 5, after an insulating layer is deposited on the exposed portions of the conductive lines and the exposed portions of the insulating layer according to one embodiment.

FIG. 6 is a view 600 similar to FIG. 5, after an insulating layer 109 is deposited on the exposed portions of the conductive lines 103 and the exposed portions of the insulating layer 104 according to one embodiment. In one embodiment, insulating layer 109 represents one or more of the insulating layers described above with respect to insulating layer 104. In one embodiment, the insulating layer 109 is deposited using one of insulating layer deposition techniques, such as but not limited to a CVD, PVD, MBE, MOCVD, ALD, spin-on, or other deposition techniques known to one of ordinary skill in the art of microelectronic device manufacturing. In one embodiment, portions of the insulating layer 109 are removed to even out top portions of the insulating layer 109 with top portions of the grid lines 108 using a CMP technique known to one of ordinary skill in the art of microelectronic device manufacturing.

Figure 7:
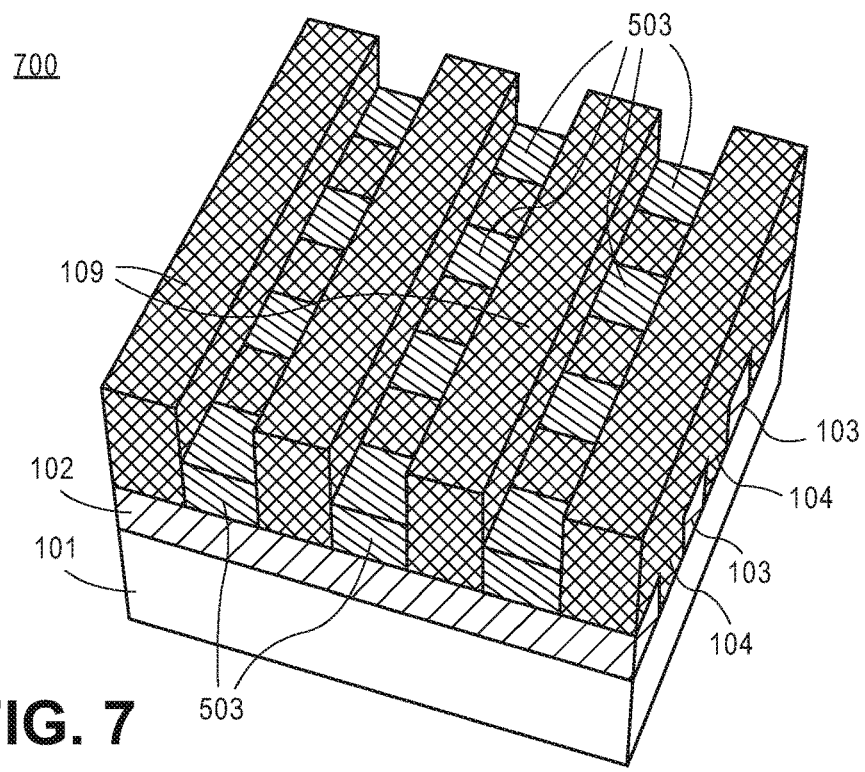
FIG. 7 is a view similar to FIG. 6, after grid lines are selectively removed according to one embodiment.

FIG. 7 is a view 700 similar to FIG. 6, after grid lines 108 are selectively removed according to one embodiment. As shown in FIG. 7, grating lines 108 are selectively removed to expose the preformed connections 503. That is, the inversion of the grating pattern performed by selective removal of the grating lines forms trenches having sidewalls that are side portions of the insulating layer 109 and bottoms that are exposed top portions of preformed connections 503. In one embodiment, the grating lines 108 are selectively removed using an anisotropic dry etch technique. In one embodiment, the grating lines 108 are selectively removed using a dry etch chemistry comprising a carbon containing gas, a fluorine containing gas, or any combination thereof. In one embodiment, the grating lines 108 are selectively removed using a dry etch chemistry comprising one or more corrosive gases, e.g., chlorine, bromine, or any combination thereof. In one embodiment, the grating lines 108 are selectively removed by ashing using one or more gases comprising an oxygen, a nitrogen, a hydrogen, or any combination thereof. In one embodiment, the grating lines 108 are selectively removed using one or more of selective wet etching, dry etching, or a combination thereof techniques known to one of ordinary skill in the art of electronic device manufacturing.

Figure 8:
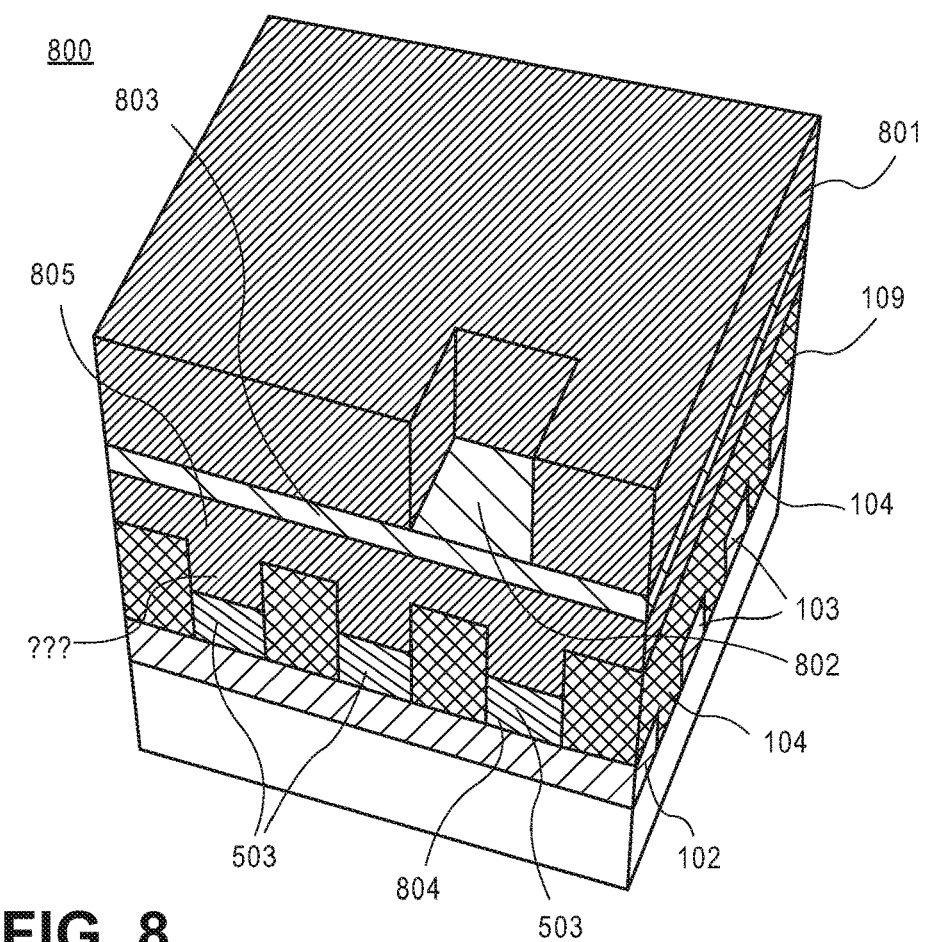
FIG. 8 is a view similar to FIG. 7, after a mask layer is deposited on the exposed portions of the insulating layer and exposed portions of the connections according to one embodiment.

FIG. 8 is a view 800 similar to FIG. 7, after a mask layer comprising a patterned photoresist layer 801 on an antireflective coating (ARC) layer 803 on a hard mask layer 805 is deposited on the exposed portions of the insulating layer 109 and exposed portions of the connections 503 according to one embodiment. In one embodiment, ARC layer 803 is one of ARC layers known to one of ordinary skill in the art of electronic device manufacturing. In one embodiment, hard mask layer 805 is a carbon hard mask layer, or other hard mask layer. As shown in FIG. 8, the photoresist layer 801 is patterned to form an opening 802 to expose a portion of the ARC layer 802 above a selected preformed connection 804 to form a via.

In one embodiment, the photoresist layer is patterned using patterning and etching techniques known to one of ordinary skill in the art of microelectronic device manufacturing. In one embodiment, the patterned photoresist layer 801 has a placement error, so that the opening 802 is misaligned relative to a selected preformed connection 804 that is one of the preformed connections 503. In another embodiment, the opening is aligned to a selected preformed connection. The mask layer comprising the patterned photoresist layer 801 on the ARC layer 803 on hard mask layer 805 is deposited using one of the deposition techniques, such as but not limited to a CVD, PVD, MBE, MOCVD, ALD, spin-on, or other deposition techniques known to one of ordinary skill in the art of microelectronic device manufacturing.

Figure 9:
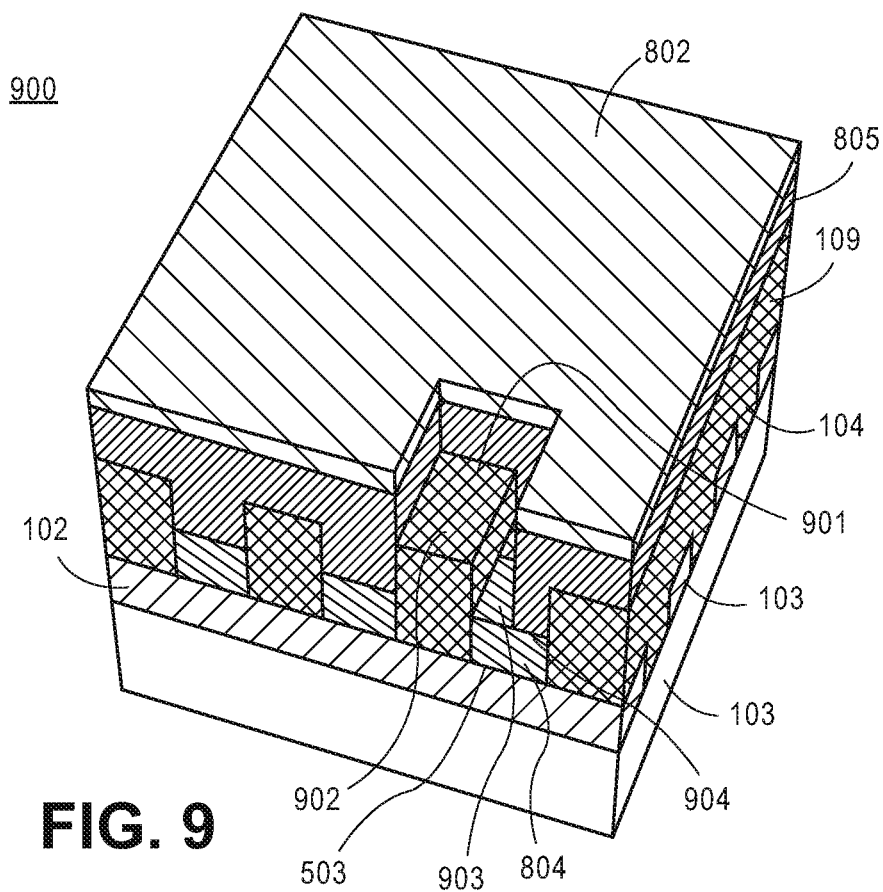
FIG. 9 is a view similar to FIG. 8, after an opening in the ARC layer and hard mask layer is formed to expose a selected preformed connection according to one embodiment.

FIG. 9 is a view 900 similar to FIG. 8, after an opening 901 in the ARC layer 802 and hard mask layer 805 is formed through the patterned photoresist layer 801 to expose a selected preformed connection according to one embodiment. As shown in FIG. 9, the patterned photoresist layer 801 is removed. The patterned photoresist layer 801 can be removed using one of the photoresist removing techniques known to one of ordinary skill in the art of microelectronic device manufacturing. In one embodiment, opening 901 exposes at least a portion 903 of the selected preformed connection 804. In one embodiment, the opening 901 is formed using one or more etching techniques known to one of ordinary skill in the art of microelectronic device manufacturing.

Figure 10:
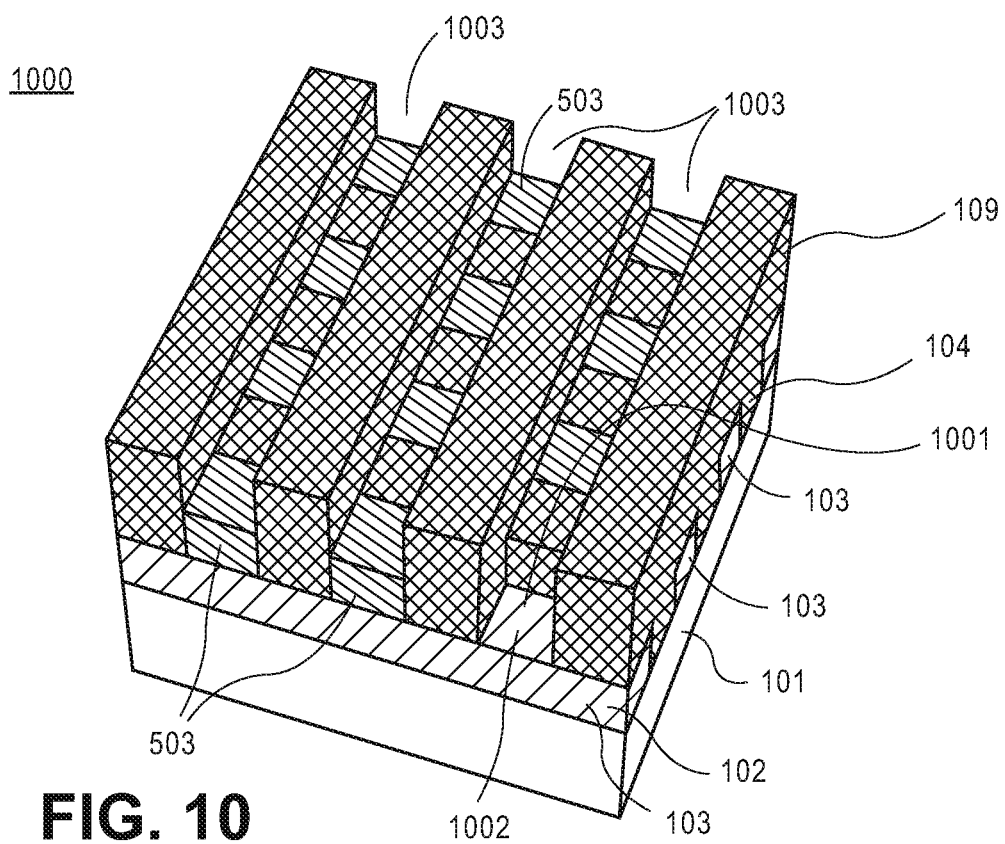
FIG. 10 is a view similar to FIG. 9, after the selected preformed connection is removed according to one embodiment.

FIG. 10 is a view 1000 similar to FIG. 9, after the selected preformed connection 804 is removed and the ARC layer 802 and hard mask layer 805 are removed according to one embodiment. As shown in FIG. 10, the portion 903 and a portion 904 of the preformed connection 804 underneath the hard mask layer 805 are removed through opening 901 to form a via opening 1001 to expose a portion 1002 of conducting line 103. As shown in FIG. 10, the ARC layer 802 and hard mask layer 805 are removed to form trenches 1003. Each trench 1003 has sidewalls that are the side portions of the insulating layer 109 and a bottom portion that includes portions of remaining preformed connections 503 and portions of insulating layer 104. Trenches 1003 extend in a direction that corresponds to a direction of conductive lines of an upper metallization layer formed later on in a process.

In one embodiment, the preformed connection 804 is removed selectively to insulating layer 109 using an isotropic etch. In one embodiment, an undercut action of the isotropic etch completely removes the selected preformed connector 804 including portions 903 and 904 even though the patterned photoresist errors may prevent the selected preformed connector from being fully uncovered. In one embodiment, selected preformed connection 804 is removed using a wet etch chemistry comprising a phosphoric acid, or other acid. In one embodiment, the selected preformed connection 804 is removed using one or more of selective isotropic wet etching, dry etching, or a combination thereof techniques known to one of ordinary skill in the art of electronic device manufacturing. In one embodiment, the ARC layer 802 and hard mask layer 805 are removed using one or more of the ARC layer and hard mask layer removal techniques, e.g., an ashing technique known to one of ordinary skill in the art of electronic device manufacturing.

Figure 11:
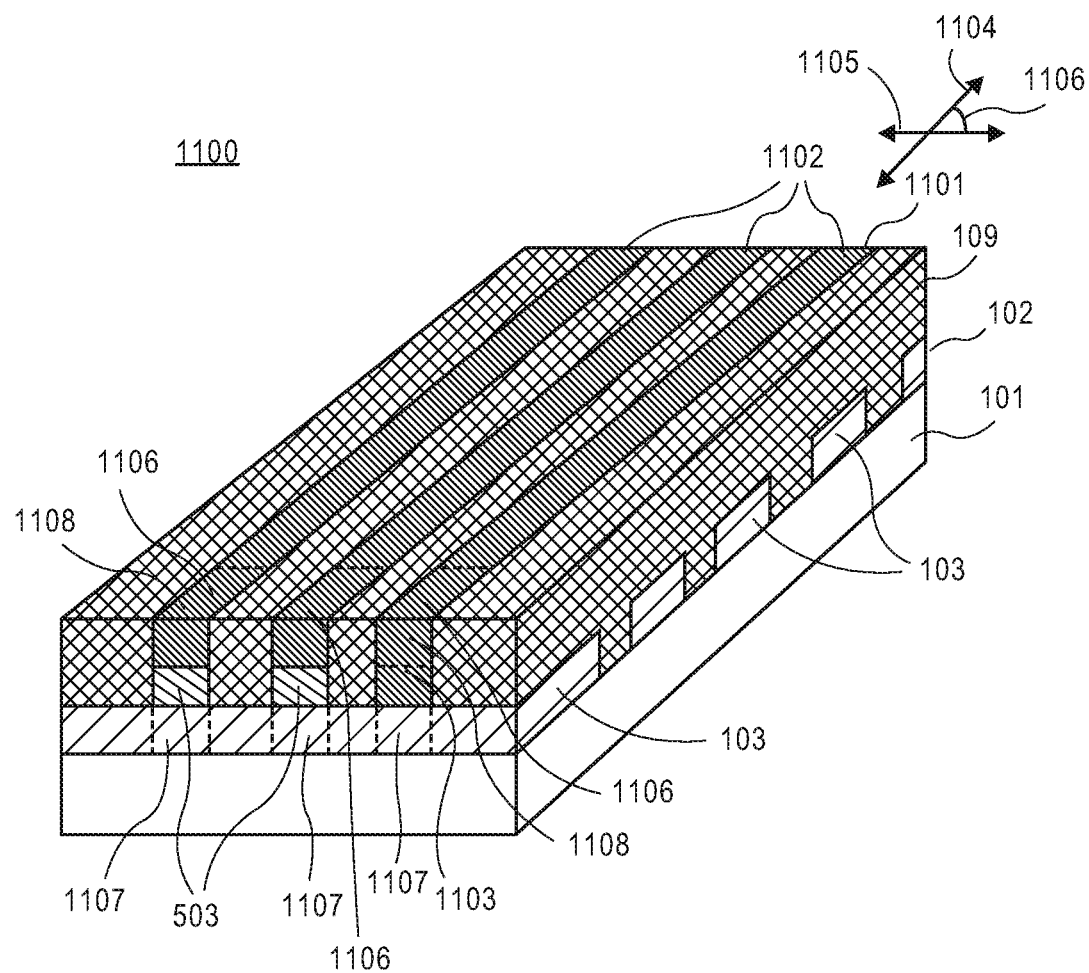
FIG. 11 is a view similar to FIG. 10, after an upper metallization layer (M+) is deposited on the lower metallization layer M-102 according to one embodiment.

FIG. 11 is a view 1100 similar to FIG. 10, after an upper metallization layer (M+) is deposited on the lower metallization layer M-102 according to one embodiment.

In one embodiment, the upper metallization layer comprises a conductive layer 1101 that is deposited on the remaining preformed connections 503 and the portions of the insulating layer 104 within trenches 1003 to form conductive lines 1102. The conductive layer 1101 is deposited through via opening 1001 onto exposed portion 1002 of conductive line 103, as shown in FIG. 11.

Figure 21:
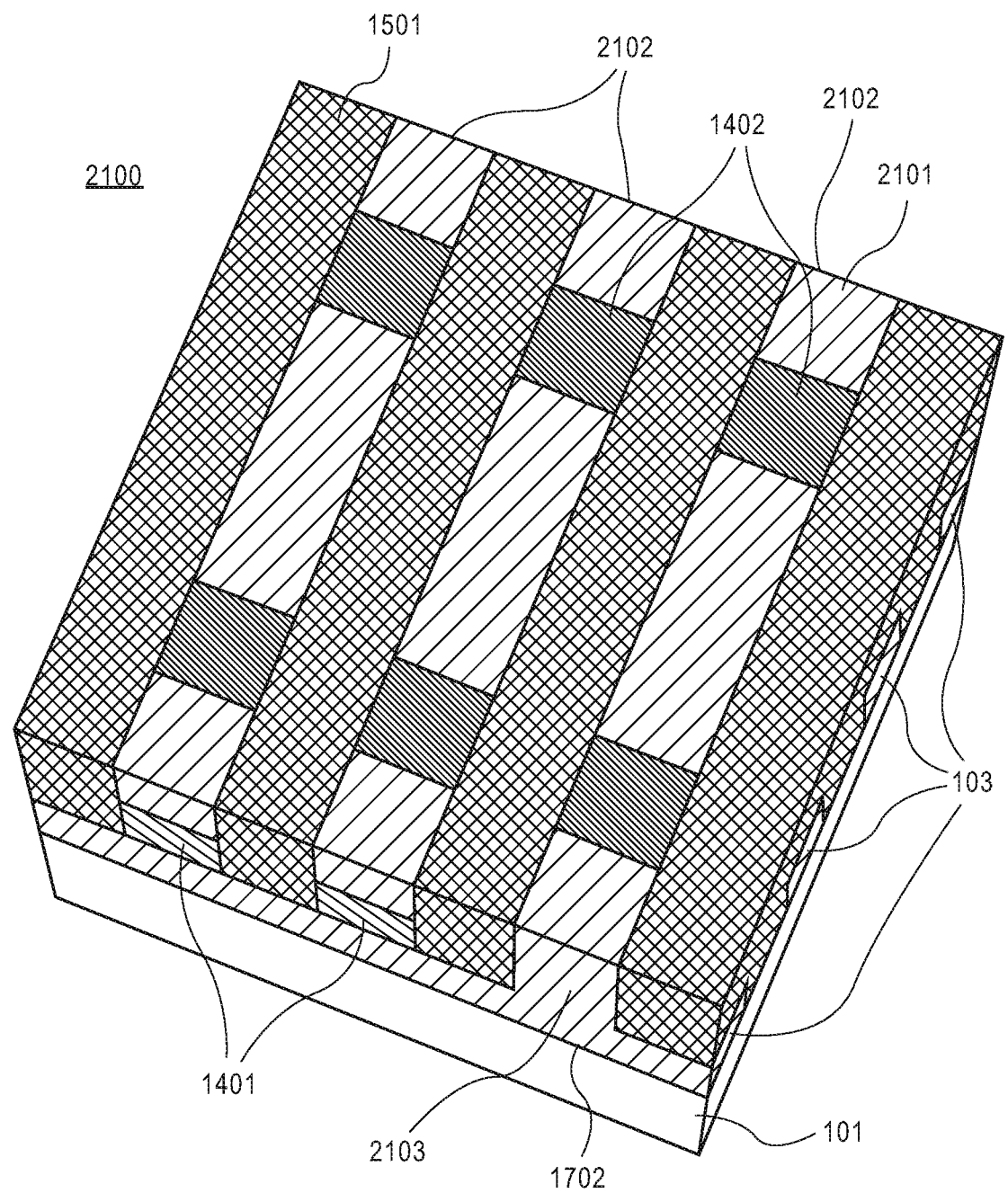
FIG. 21 is a view similar to FIG. 20, after an upper metallization layer (M+) is deposited on the lower metallization layer M-102 according to another embodiment.

As shown in FIG. 11, conductive lines 1102 extend along a direction 1104 that crosses a direction 1105 of conductive lines 103 at an angle 1106 to form intersection regions 1106. In one embodiment, the angle 1106 is about 90 degrees, so that the conductive lines 103 and conductive lines 1102 propagate in directions that are substantially orthogonal to each of other. As shown in FIG. 11, each intersection region 1106 comprises a portion 1107 of conductive line 103 and a portion 1108 of conductive line 1102 on the portion 1107. A plurality of connections comprising preformed connections 503 and one or more self-aligned conductive connections are disposed between the metallization layer 102 and metallization layer 1101 at the intersection regions 1106, as shown in FIG. 11. As shown in FIG. 11, each preformed connection 503 is a part of the corresponding intersection region 1106. Each preformed connection 503 is aligned to and is between the corresponding portion 1108 of one of the conductive lines 1102 and the corresponding portion 1107 of one of the conductive lines 103. The preformed connections 503 are portions of insulating layer 106. The one or more self-aligned conductive connections comprise a conductive via 1103 formed at a location defined by the selected preformed connection 804. The connections are substantially orthogonal to the conductive lines 103 and conductive lines 1102, as shown in FIG. 11. Conductive lines 1102 are separated by portions of insulating layer 109, as shown in FIG. 21.

In one embodiment, forming the conductive lines 1102 involves filling the trenches 1003 with a layer of conductive material. In one embodiment, a base layer (not shown) is first deposited on the internal sidewalls and bottom of the trenches 1003, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper).

In one embodiment, to form the base layer, the conductive barrier layer is deposited onto the sidewalls and bottom of the trenches 1003, and then the seed layer is deposited on the conductive barrier layer. In another embodiment, the conductive base layer includes the seed layer that is directly deposited onto the sidewalls and bottom of the trenches 1003. In one embodiment, the conductive barrier layer is represented by one of the conductive barrier layers described above. In one embodiment, the seed layer is represented by one of the seed layers described above. In one embodiment, the barrier layer may be omitted altogether and appropriate doping of the copper line may be used to make a "self-forming barrier".

In one embodiment, the conductive layer 1101 is represented by one or more conductive layers described above with respect to conductive lines 103. In one embodiment, the conductive layer 1101 is deposited using a damascene process known to one of ordinary skill in the art of microelectronic device manufacturing. In one embodiment, the conductive layer 1101 is deposited using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In one embodiment, portions of the conductive layer and the base layer are removed to even out top portions of the conductive lines 1102 with top portions of the insulating layer 109 using a CMP technique known to one of ordinary skill in the art of microelectronic device manufacturing.

In one non-limiting example, the thickness of the conductive lines 1102 is in an approximate range from about 15 nm to about 1000 nm. In one non-limiting example, the thickness of the conductive lines 1102 is from about 20 nm to about 200 nm. In one non-limiting example, the width of the conductive lines 1102 is in an approximate range from about 5 nm to about 500 nm. In one non-limiting example, the spacing (pitch) between the conductive lines 1102 is from about 2 nm to about 500 nm. In more specific non-limiting example, the spacing (pitch) between the conductive lines 1102 is from about 20 nm to about 40 nm.

Figure 12:
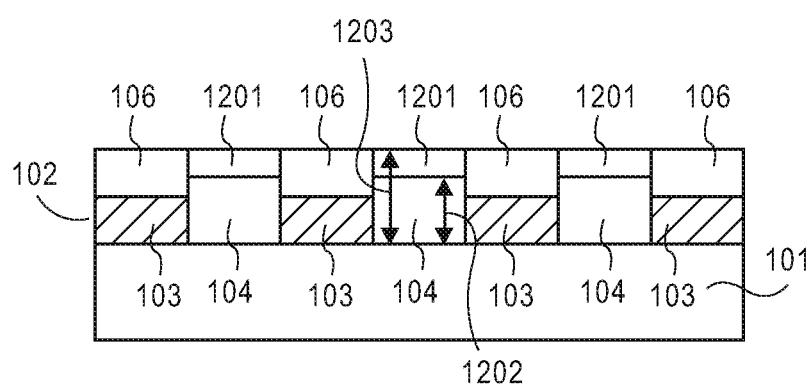
FIG. 12 is a view similar to FIG. 3A, after portions of the insulating layer between the portions of the insulating layer are recessed, and an insulating layer is deposited on the recessed portions of the insulating layer according to another embodiment.

FIG. 12 is a view 1200 similar to FIG. 3A, after portions of the insulating layer 104 between the portions of the insulating layer 106 are recessed, and an insulating layer 1201 is deposited on the recessed portions of the insulating layer 104 according to another embodiment. In one embodiment, insulating layer 1201 is deposited to form one or more line termination regions later on in a process, as described in further detail below. As shown in FIG. 12, the portions of the insulating layer 104 are recessed to a predetermined thickness 1202 to form trenches. In one embodiment, the trenches have sidewalls that comprise portions of insulating layer 106, and bottoms that are top surfaces of the recessed portions of the insulating layer 104.

In one embodiment, the thickness 1202 of the recessed portions of the insulating layer 104 is from about 50% to about 90% of the initial thickness 1203 of the insulating layer 104. In one embodiment, the portions of the insulating layer 104 are recessed using one or more of wet etching, dry etching, or a combination thereof techniques known to one of ordinary skill in the art of electronic device manufacturing.

In one embodiment, insulating layer 1201 is etch selective to the insulating layer 104. In one embodiment, the ratio of the etching rate of the insulating layer 1201 to that of the insulating layer 104 is at least 8:1. In one embodiment, the insulating layer 1202 is a silicon carbide (SiC) layer. In alternative embodiments, the insulating layer 1201 is a silicon nitride, silicon nitride carbide, or any combination thereof. In alternate embodiments, insulating layer 1201 is an oxide layer, e.g., a silicon oxide layer, a carbon doped oxide layer, e.g., a carbon doped silicon oxide layer, a silicon oxy carbide (SiOC) layer, a fluorine-doped silicon oxide, a metal oxide, e.g., a titanium oxide, an aluminum oxide, a hafnium oxide, or any other metal oxide; a hydrogen-silesquioxane (HSQ), a fluorinated amorphous carbon, a methylsesquioxane (MSQ), a nitride layer, e.g., a silicon nitride, a titanium nitride, a silicon oxide nitride, silicon carbide, or other insulating layer. In one embodiment, insulating layer 1201 of silicon carbide is deposited on the recessed portions of the insulating layer 104 of silicon oxide.

In an embodiment, the insulating layer 1201 is deposited using one of deposition techniques, such as but not limited to a CVD, PVD, MBE, MOCVD, ALD, spin-on, or other insulating layer deposition techniques known to one of ordinary skill in the art of microelectronic device manufacturing.

In one embodiment, portions of the insulating layer 1201 are removed to even out top portions of the insulating layer 106 with top portions of the insulating layer 1201 using a CMP technique known to one of ordinary skill in the art of microelectronic device manufacturing.

Figure 13A:
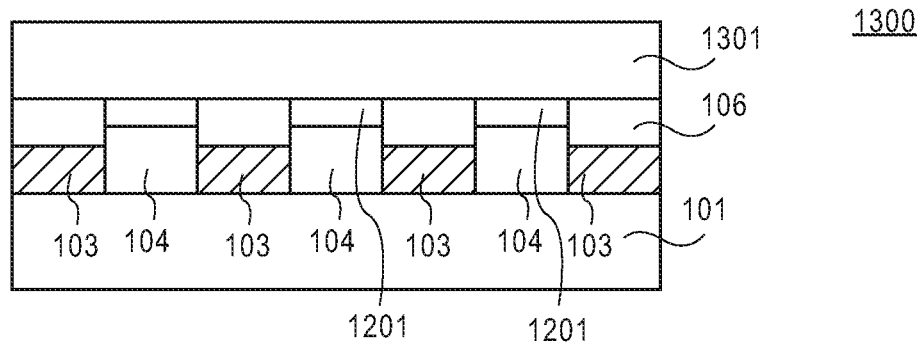
FIG. 13A is a view that is similar to FIG. 12, after a grating layer is deposited on portions of the insulating layer according to another embodiment.
Figure 13B:
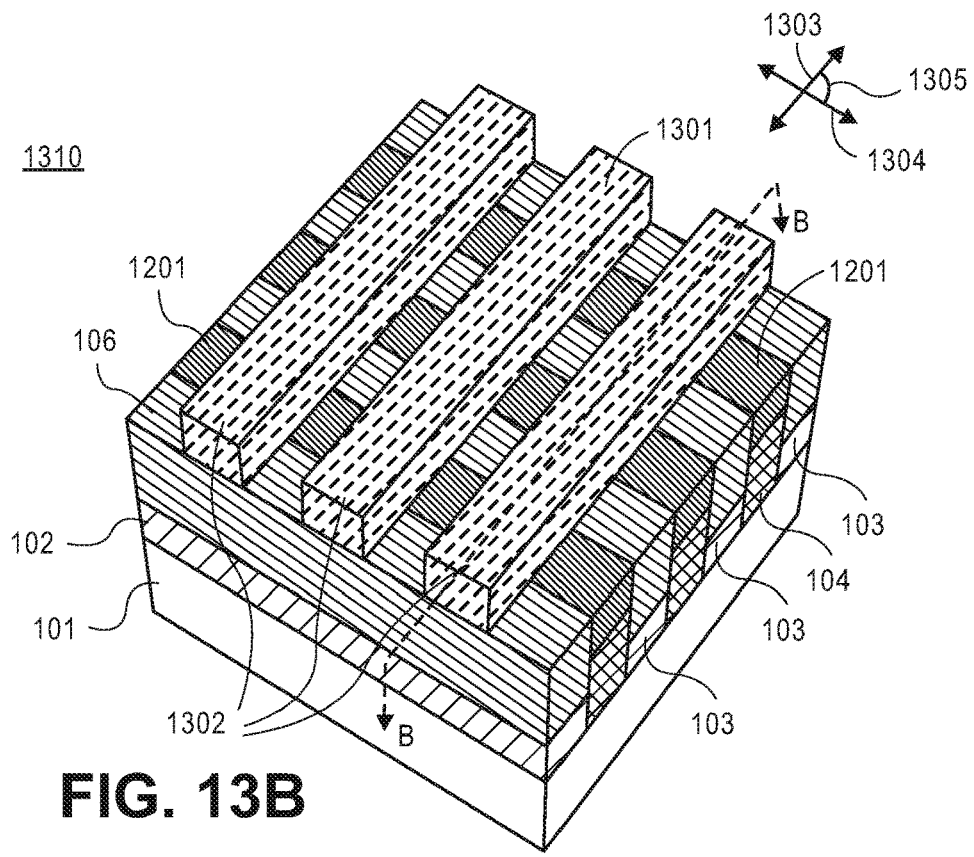
FIG. 13B is a perspective view of the electronic device structure depicted in FIG. 13A according to one embodiment.

FIG. 13A is a view 1300 that is similar to FIG. 12 after a grating layer 1301 is deposited on portions of the insulating layer 1201 and portions of the insulating layer 106 according to another embodiment. FIG. 13B is a perspective view 1310 of the electronic device structure depicted in FIG. 13A according to one embodiment. FIG. 13A is a cross-sectional view of the electronic device structure illustrated in FIG. 13B along an axis B-B' according to one embodiment.

As shown in FIGS. 13A and 13B, grating layer 1301 comprises a set of grating lines 1302 that are used as a grid to form conductive lines of an upper metallization layer later in a process. As shown in FIGS. 13A and 13B, grating lines 1302 extend in a direction 1303 that is at an angle 1305 relative to a direction 1304 of conductive lines 103. In one embodiment, angle 1305 is about 90 degrees, so that grating lines 1302 extend in a direction that is substantially orthogonal to the propagation direction of the conductive lines 103. The grating lines 1302 cross the conductive lines 103 to form intersection regions, as described above with respect to FIG. 4B. As shown in FIGS. 13A and 13B, portions of the insulating layer 1201 and insulating layer 106 are exposed by the grating lines 1302.

In one embodiment, grating layer 1302 comprises a material that is etch selective to the insulating layer 104, the insulating layer 106, and insulating layer 1201. In one embodiment, the ratio of the etching rate of the grating layer 107 to that of the insulating layers 106, 104 and 1201 is at least 8:1.

In one embodiment, grating layer 1301 is a semiconductor layer, e.g., silicon, germanium, or other semiconductor layer, a metal oxide layer, e.g., titanium oxide, aluminum oxide, other metal oxide layer, a metal nitride layer, e.g., a titanium nitride, aluminum nitride, other metal nitride layer, other material layer, or any combination thereof that is etch selective to the insulating layers 104, 106 and 1201. In one embodiment, grating layer 1301 is a silicon layer, insulating layer 106 is a silicon nitride layer, insulating layer 104 is a silicon oxide layer, and insulating layer 1201 is a silicon carbide layer.

In one embodiment, the grating layer 1301 is blanket deposited on the insulating layers 1201 and 106. In one embodiment, a hard mask (not shown) is deposited on grating layer 1301. In one embodiment, the grating layer 1301 is patterned and etched using the hard mask to form grating lines 1302 using one or more patterning and etching techniques known to one of ordinary skill in the art of microelectronic device manufacturing. In one embodiment, the grating layer 1301 is deposited using one of deposition techniques, such as but not limited to a CVD, PVD, MBE, MOCVD, ALD, spin-on, or other deposition techniques known to one of ordinary skill in the art of microelectronic device manufacturing. In one embodiment, the dimensions of the grating lines 1302 are similar to that of the conductive lines 103. In one embodiment, the pitch between the grating lines 1302 is similar to that of the conductive lines 103.

Figure 14:
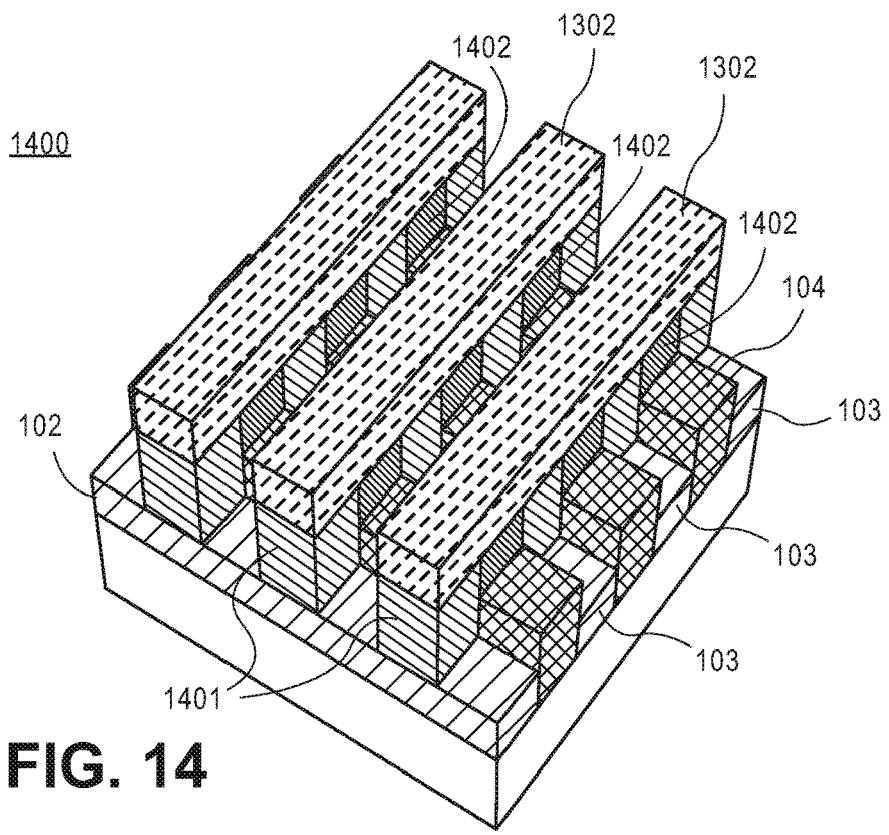
FIG. 14 is a view similar to FIG. 13B, after the exposed portions of the insulating layers are selectively removed using grating lines as a mask according to another embodiment.

FIG. 14 is a view 1400 similar to FIG. 13B after the exposed portions of the insulating layers 106 and 1201 are selectively removed using grating lines 1302 as a mask according to another embodiment. The portions of the insulating layers 106 and 1201 exposed by grating lines 108 are removed to expose portions of the conductive lines 103 and portions of the insulating layer 104. As shown in FIG. 14, preformed connections 1401 are formed on portions of conductive lines 103. In one embodiment, preformed connections 1401 are represented by preformed connections 503. Portions 1402 of insulating layer 1201 underneath the grating lines 1302 represent line termination regions. As shown in FIG. 14, the portions 1402 are aligned to preformed connections 1401.

In one embodiment, the exposed portions of the insulating layer 106 and 1201 are removed selectively to insulating layer 104 by an isotropic wet etch chemistry comprising a phosphoric acid, or other acid. In one embodiment, the exposed portions of the insulating layer 106 and 1201 are removed using one or more of selective wet etching, dry etching, or a combination thereof techniques known to one of ordinary skill in the art of electronic device manufacturing.

Figure 15:
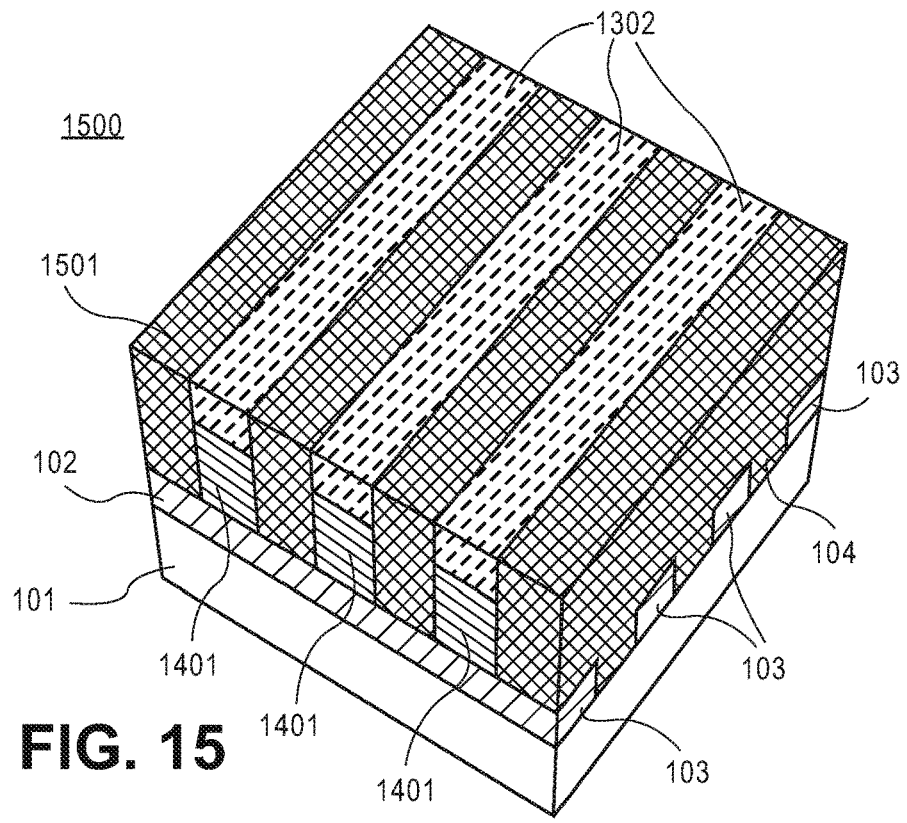
FIG. 15 is a view similar to FIG. 14, after an insulating layer is deposited on the exposed portions of the conductive lines according to another embodiment.

FIG. 15 is a view 1500 similar to FIG. 14, after an insulating layer 1501 is deposited on the exposed portions of the conductive lines 103 and the exposed portions of the insulating layer 104 according to another embodiment. In one embodiment, insulating layer 1501 represents one or more of the insulating layers described above with respect to insulating layer 104. In one embodiment, the insulating layer 1501 is deposited using one of insulating layer deposition techniques, such as but not limited to a CVD, PVD, MBE, MOCVD, ALD, spin-on, or other deposition techniques known to one of ordinary skill in the art of microelectronic device manufacturing. In one embodiment, portions of the insulating layer 1501 are removed to even out top portions of the insulating layer 1501 with top portions of the grid lines 1302 using a CMP technique known to one of ordinary skill in the art of microelectronic device manufacturing.

Figure 16:
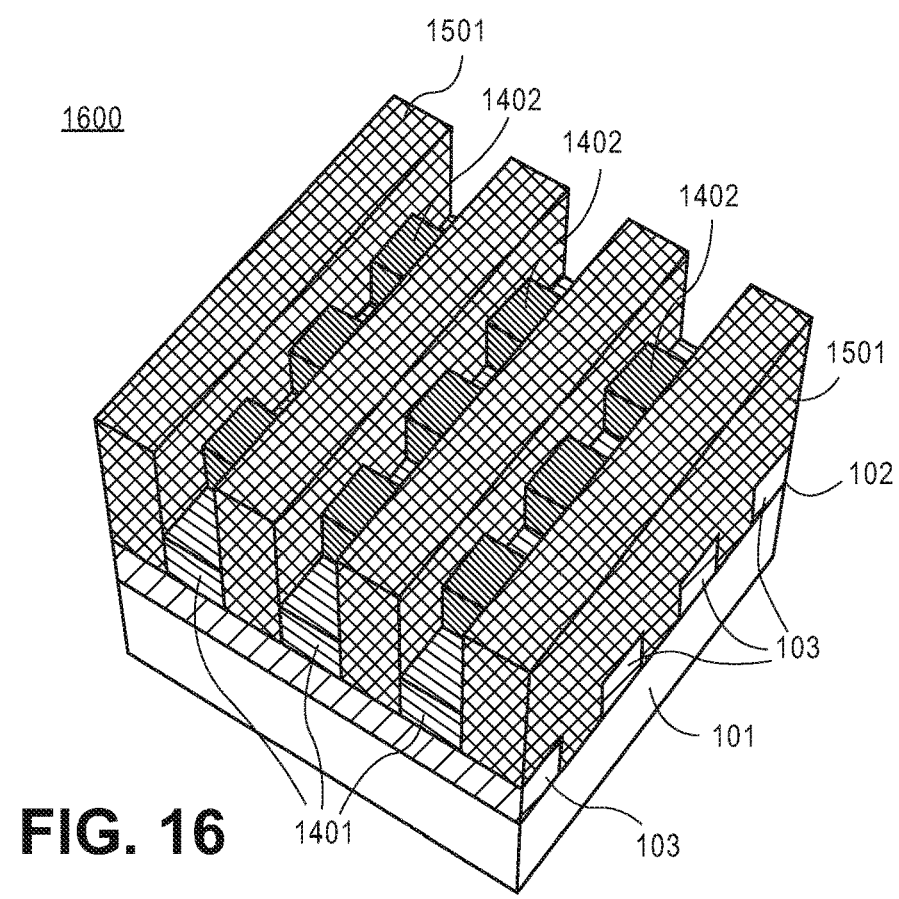
FIG. 16 is a view similar to FIG. 15, after grid lines are selectively removed according to another embodiment.

FIG. 16 is a view 1600 similar to FIG. 15, after grid lines 1302 are selectively removed according to another embodiment. As shown in FIG. 16, grating lines 1302 are selectively removed to expose the preformed connections 1401 and line termination regions 1402. That is, the inversion of the grating pattern performed by selective removal of the grating lines forms trenches having sidewalls that are side portions of the insulating layer 1501 and bottoms that are exposed top portions of preformed connections 503 and line termination regions 1402. In one embodiment, the grating lines 1302 are selectively removed using one of the grating line removal techniques described above with respect to grating lines 108.

Figure 17:
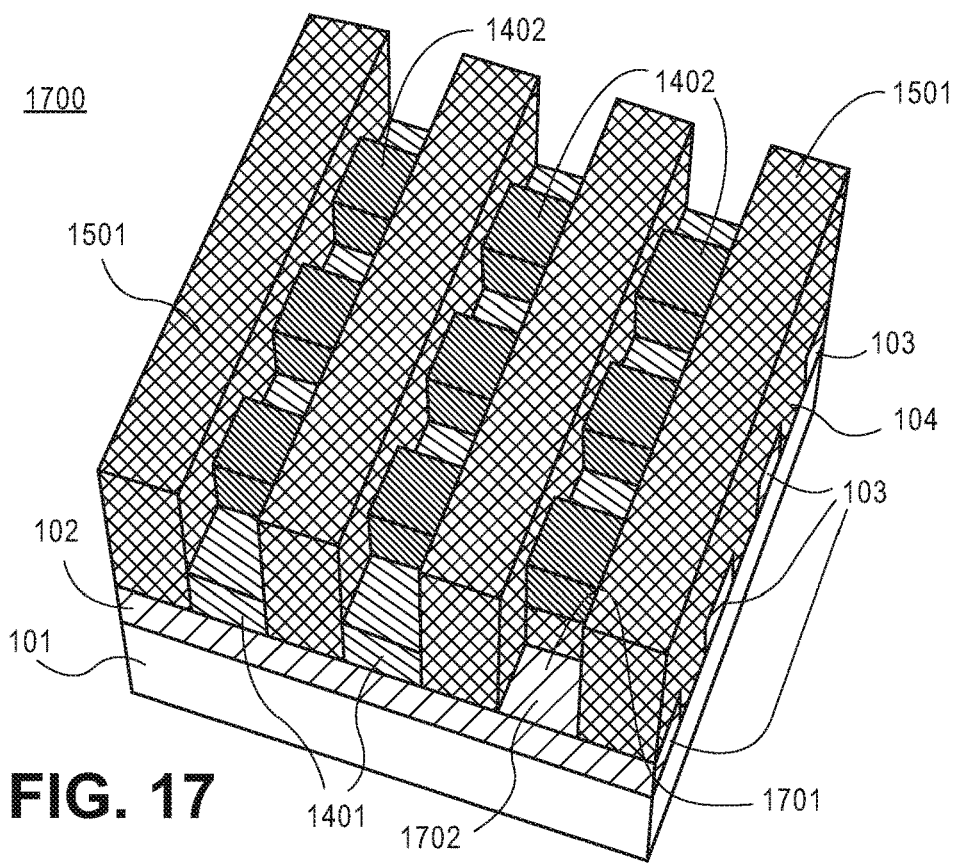
FIG. 17 is a view similar to FIG. 16, after a via opening is formed to expose a portion of conducting line according to another embodiment.

FIG. 17 is a view 1700 similar to FIG. 16, after a via opening 1701 is formed to expose a portion 1702 of conducting line 103 according to another embodiment. In one embodiment, a patterned mask layer (not shown) is deposited on the portions of the insulating layer 1502, preformed connections 1401 and line termination regions 1402 to expose a selected preformed connection 804, as described above with respect to FIGS. 8 and 9. In one embodiment, the selected preformed connection 804 is selectively removed to expose portion 1702 of the conductive line 103 using one or more preformed connection removing techniques, as described above with respect to FIG. 10.

Figure 18:
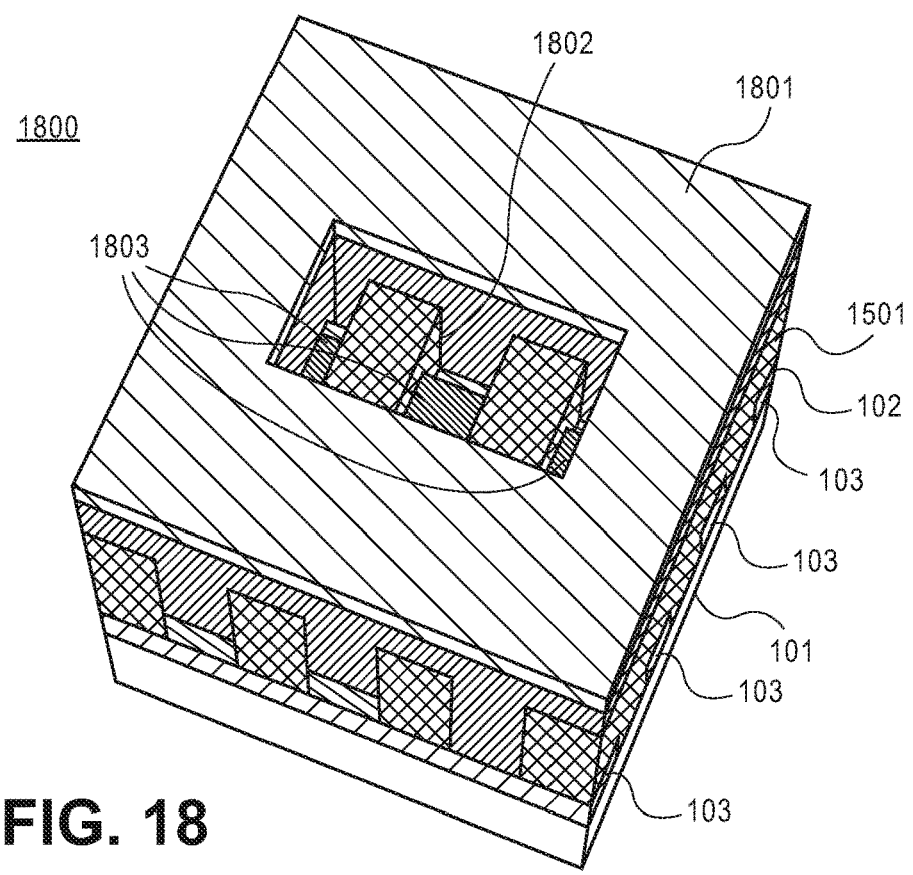
FIG. 18 is a view similar to FIG. 17, after a patterned mask layer is deposited on the portions of the insulating layer according to another embodiment.

FIG. 18 is a view 1800 similar to FIG. 17, after a patterned mask layer 1801 is deposited on the portions of the insulating layer 1502, preformed connections 1401 and line termination regions 1402 according to another embodiment. The patterned mask layer 1801 has an opening 1802 that exposes selected line termination regions (plugs) 1803. The patterned mask layer 1801 represents one of the patterned mask layers described above with respect to FIGS. 8 and 9. As shown in FIG. 18, some of the plugs 1803 are only partially exposed (uncovered) due to patterning misalignment errors.

Figure 19:
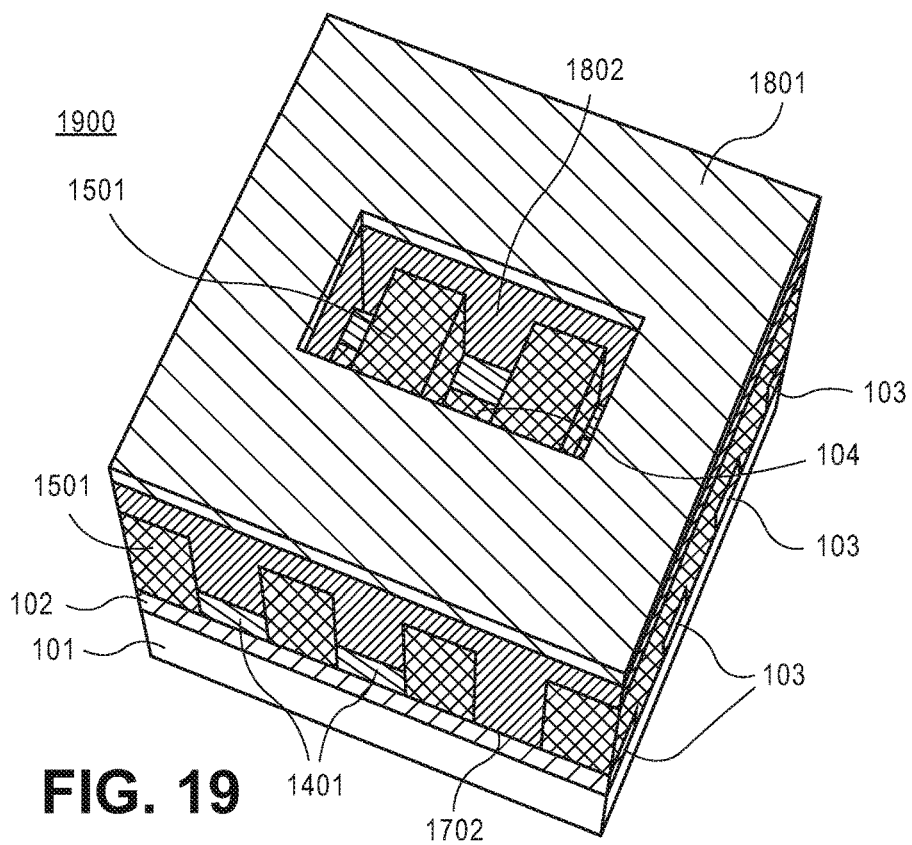
FIG. 19 is a view similar to FIG. 18, after the selected plugs are removed through opening to expose portions of the insulating layer according to another embodiment.

FIG. 19 is a view 1900 similar to FIG. 18, after the selected plugs 1803 are removed through opening 1802 to expose portions of the insulating layer 104 and portions of insulating layer 1501 according to another embodiment. In one embodiment, the plugs 1803 are removed selectively to insulating layer 104 using an isotropic etch. In one embodiment, an undercut action of the isotropic etch completely removes the selected plugs 1801 including the portions of the plugs 1803 that are covered by the mask layer 1801 even though the patterned mask errors may prevent the selected plug from being fully uncovered. In one embodiment, selected plugs 1803 are removed using a wet etch chemistry comprising a phosphoric acid, or other acid. In one embodiment, the selected plugs 1803 are removed using one or more of selective isotropic wet etching, dry etching, or a combination thereof techniques known to one of ordinary skill in the art of electronic device manufacturing.

Figure 20:
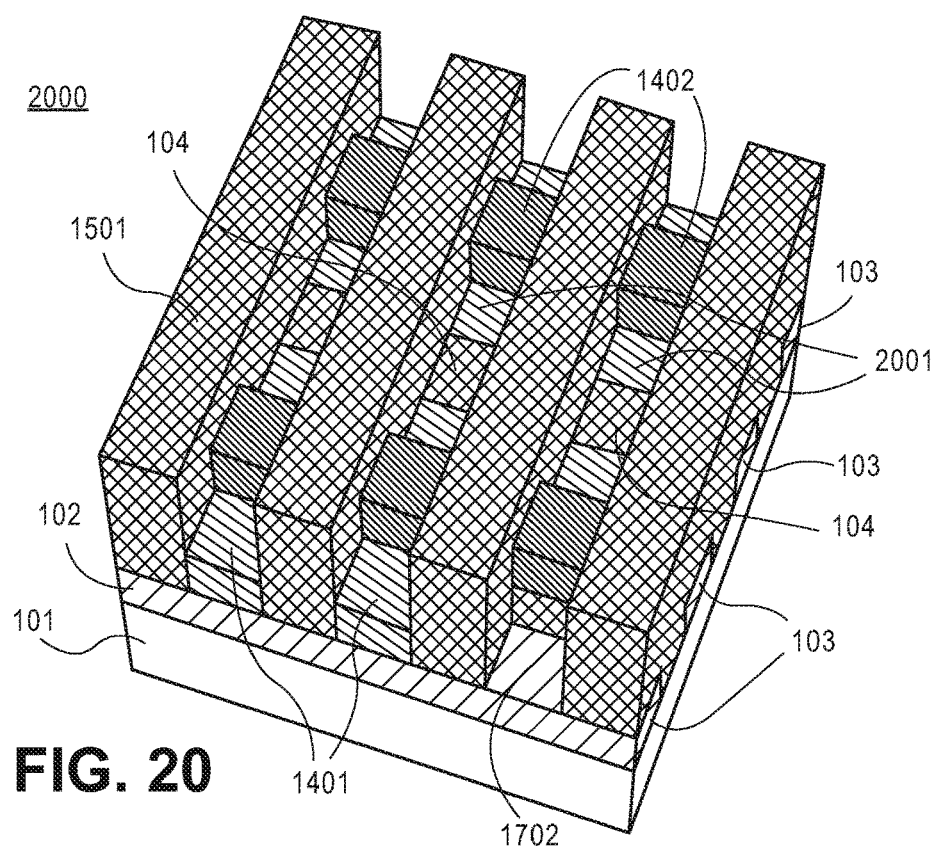
FIG. 20 is a view similar to FIG. 19, after the mask layer is removed according to another embodiment.

FIG. 20 is a view 2000 similar to FIG. 19, after the mask layer 1801 is removed according to another embodiment. As shown in FIG. 20, the mask layer 1801 is removed to form trenches 2001. At least one of the trenches 2001 has a pair of opposing sidewalls that are the side portions of the insulating layer 1501 and a pair of opposing sidewalls that are side portions of the remaining plugs 1402. At least one of the trenches 2001 has a bottom portion that includes portions of insulating layer 104 and portions of remaining preformed connections 1401. At least one of the trenches 2001 has a via opening, such as via opening 1702 to expose a portion of the conductive line 103, as shown in FIG. 20.

Trenches 2001 extend in a direction that corresponds to a direction of conductive lines of an upper metallization layer formed later on in a process. In one embodiment, the mask layer 1801 is removed using one or more of the mask layer removal techniques, e.g., an ashing technique known to one of ordinary skill in the art of electronic device manufacturing.

FIG. 21 is a view 2100 similar to FIG. 20, after an upper metallization layer (M+) is deposited on the lower metallization layer M-102 according to another embodiment. In one embodiment, the upper metallization layer comprises a conductive layer 2101 that is deposited on the remaining preformed connections 1401 and the portions of the insulating layer 104 within trenches 2001 to form conductive lines 2102. The conductive layer 2101 is deposited through via opening 1701 onto portion 1702 of conductive line 103 to form a conductive via 2103, as shown in FIG. 21. Conductive lines 2102 are terminated at the line termination regions 1402, as shown in FIG. 21. Conductive lines 2102 are separated by portions of insulating layer 1501, as shown in FIG. 21.

As shown in FIG. 21, conductive lines 2102 extend along a direction that crosses a direction of conductive lines 103 at an angle to form intersection regions, as described above with respect to FIG. 11. In one embodiment, the conductive lines 103 and conductive lines 2102 propagate in directions that are substantially orthogonal to each of other, as described above.

In one embodiment, the conductive lines 2102 are represented by conductive lines 1102. In one embodiment, conductive lines 2102 are formed using one or more conductive line forming techniques described above with respect to FIG. 11. In one embodiment, portions of the conductive layer 2101 are removed to even out top portions of the conductive lines 2102 with top portions of the insulating layer 1501, as described above with respect to FIG. 11.

Figure 22:
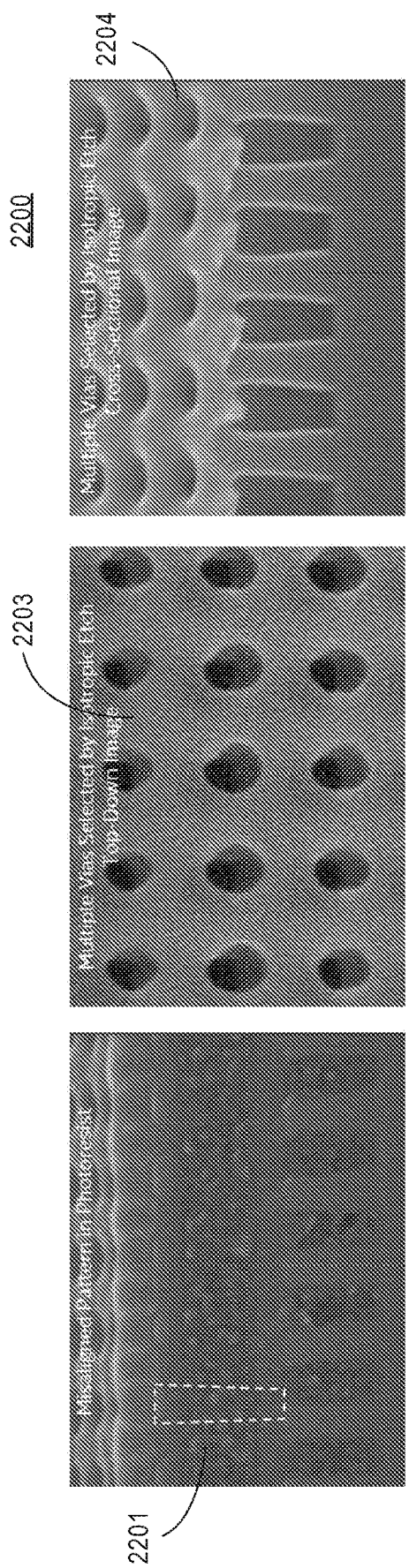
FIG. 22 is a view showing images illustrating patterning misalignment that is recovered by an isotropic etch according to one embodiment.

FIG. 22 is a view 2200 showing images illustrating patterning misalignment that is recovered by an isotropic etch according to one embodiment. An image 2201 illustrates a patterned photoresist that is misaligned relative to a preformed connection. An image 2203 is a top down image illustrating openings in a patterned mask layer above selected preformed connections that are misaligned. As shown in image 2203, the selected preformed connections are only partially uncovered by the mask layer. An image 2204 is a cross-sectional image illustrating via openings that are formed by removing selected preformed connections through the misaligned openings in the mask layer using an isotropic etch, as described above. As shown in image 2204, the via openings are formed by removing the selected preformed connection using the isotropic etch, so that misalignment in the mask pattern is recovered.

Figure 23:
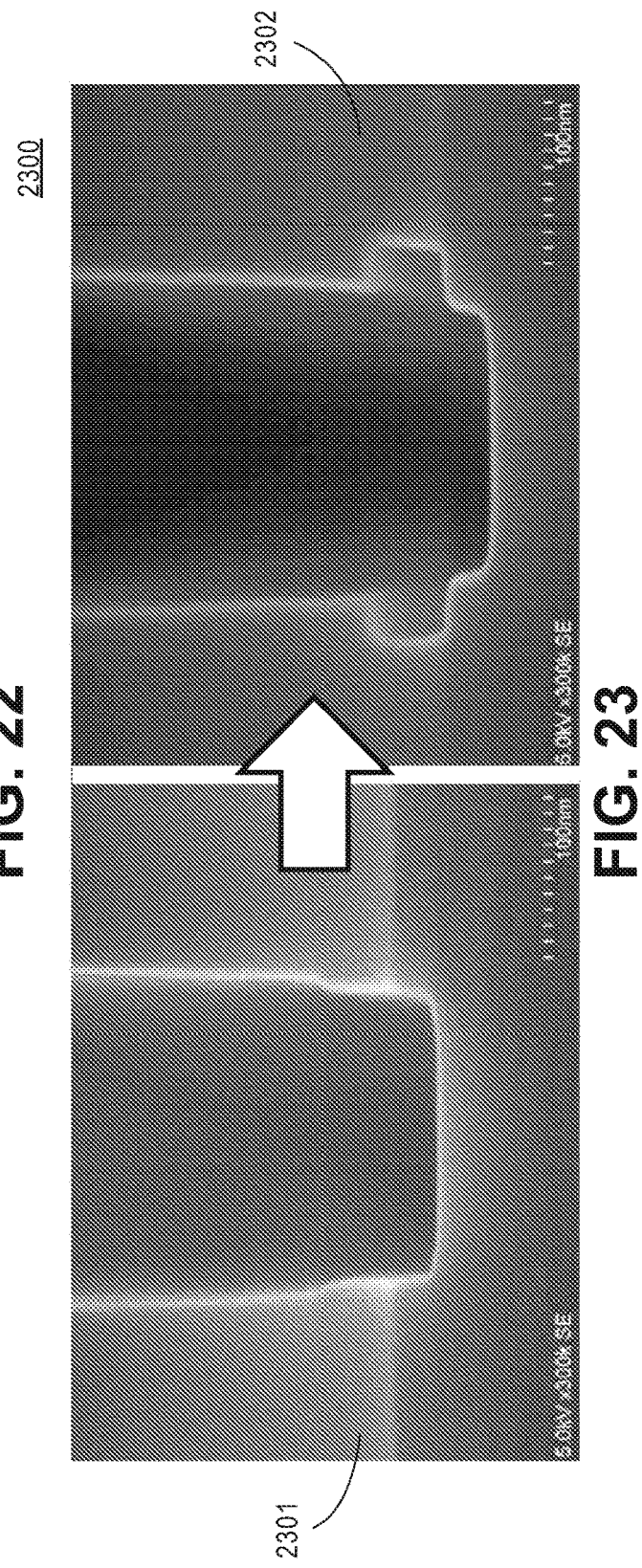
FIG. 23 is a view showing images illustrating a selective isotropic etch of the preformed connection of silicon nitride according to one embodiment.

FIG. 23 is a view 2300 showing images illustrating a selective isotropic etch of the preformed connection of silicon nitride according to one embodiment. An image 2301 illustrates a preformed connection of silicon nitride that is partially uncovered due to misaligned mask pattern. An image 2302 illustrates a via formed by removing the preformed connection of silicon nitride using an isotropic etch that is etch selective to the grid lines of silicon and the insulating layer of silicon oxide. As shown in image 2302, the misalignment in the photoresist pattern has been recovered using the isotropic etch that etches the preformed connection including portions covered by the misaligned mask through an undercut action.

Figure 24:
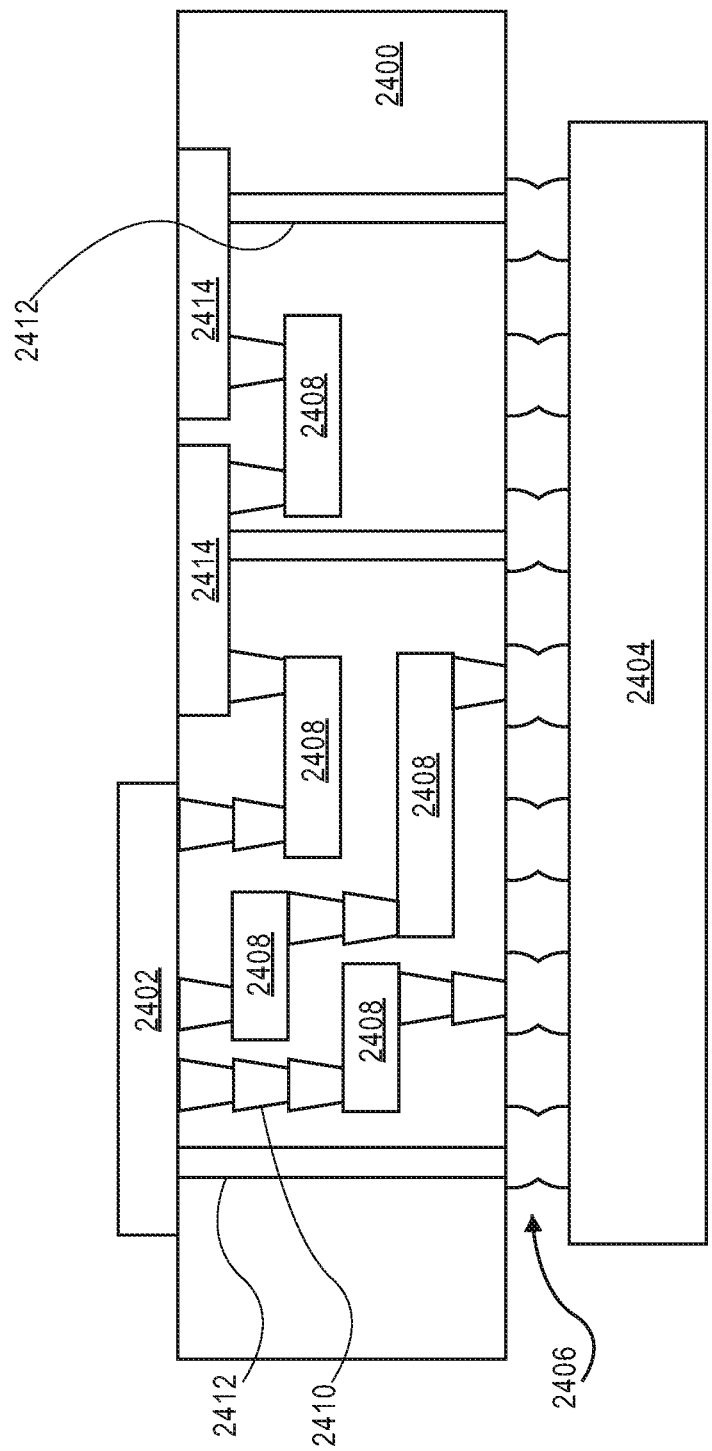
FIG. 24 illustrates an interposer that includes one or more embodiments of the invention.

FIG. 24 illustrates an interposer 2400 that includes one or more embodiments of the invention. The interposer 2400 is an intervening substrate used to bridge a first substrate 2402 to a second substrate 2404. The first substrate 2402 may be, for instance, an integrated circuit die that includes electronic devices as described herein, transistors, diodes, or other semiconductor based devices. The second substrate 2404 may be, for instance, a memory module, a computer motherboard, or another integrated circuit die that includes electronic devices as described herein, transistors, diodes, or other semiconductor based devices. Generally, the purpose of an interposer 2400 is to spread a connection to a wider pitch or to reroute a connection to a different connection. For example, an interposer 2400 may couple an integrated circuit die to a ball grid array (BGA) 2406 that can subsequently be coupled to the second substrate 2404. In some embodiments, the first and second substrates 2402/2404 are attached to opposing sides of the interposer 2400. In other embodiments, the first and second substrates 2402/2404 are attached to the same side of the interposer 2400. And in further embodiments, three or more substrates are interconnected by way of the interposer 2400.

The interposer 2400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 2408, vias 2410 and through-silicon vias (TSVs) 2412 fabricated using embodiments as described herein. The interposer 2400 may further include embedded devices 2414, including passive and active devices, such as, but not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 2400. In accordance with embodiments of the invention, apparatuses or processes disclosed herein may be used in the fabrication of interposer 2400.

Figure 25:
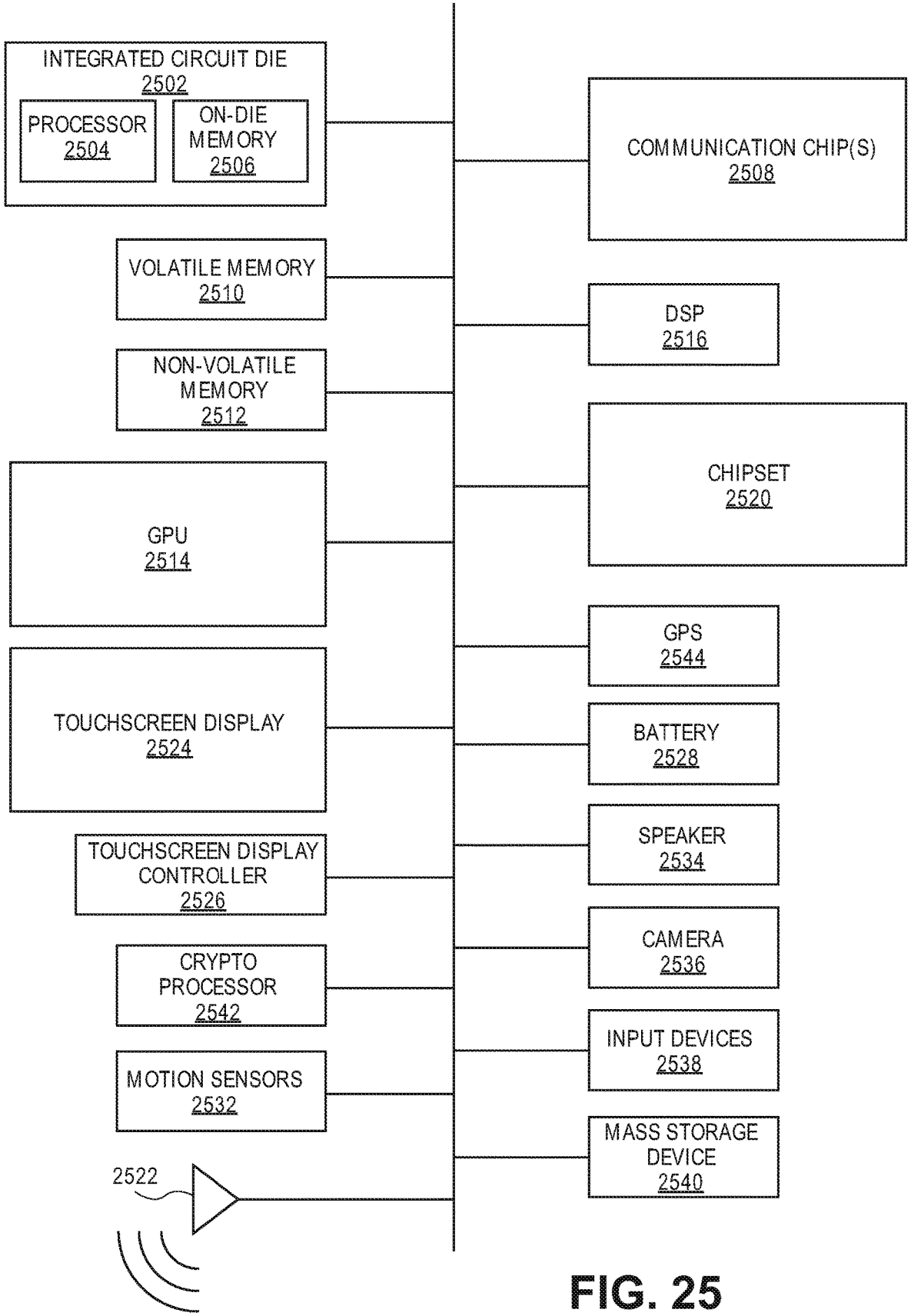
FIG. 25 illustrates a computing device in accordance with one embodiment of the invention.

FIG. 25 illustrates a computing device 2500 in accordance with one embodiment of the invention. The computing device 2500 may include a number of components. In one embodiment, these components are attached to one or more motherboards. In an alternate embodiment, these components are fabricated onto a single system-on-a-chip (SoC) die rather than a motherboard. The components in the computing device 2500 include, but are not limited to, an integrated circuit die 2502 and at least one communication chip 2508. In some implementations the communication chip 2508 is fabricated as part of the integrated circuit die 2502. The integrated circuit die 2502 may include a processor 2504 such as a central processing unit (CPU), an on-die memory 2506, often used as cache memory, that can be provided by technologies such as embedded DRAM (eDRAM) or spin-transfer torque memory (STTM or STTM-RAM).

Computing device 2500 may include other components that may or may not be physically and electrically coupled to the motherboard or fabricated within an SoC die. These other components include, but are not limited to, a volatile memory 2510 (e.g., DRAM), a non-volatile memory 2512 (e.g., ROM or flash memory), a graphics processing unit 2514 (GPU), a digital signal processor 2516 (DSP), a crypto processor 2542 (a specialized processor that executes cryptographic algorithms within hardware), a chipset 2520, an antenna 2522, a display or a touchscreen display 2524, a touchscreen display controller 2526, a battery 2528 or other power source, a global positioning system (GPS) device 2544, a power amplifier (PA), a compass, a motion coprocessor or sensors 2532 (that may include an accelerometer, a gyroscope, and a compass), a speaker 2534, a camera 2536, user input devices 2538 (such as a keyboard, mouse, stylus, and touchpad), and a mass storage device 2540 (such as hard disk drive, compact disk (CD), digital versatile disk (DVD), and so forth).

The communication chip 2508 enables wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2500 may include a set of communication chips 2508. For instance, a first communication chip 2508 may be dedicated to shorter range wireless communications such as Wi-Fi and Bluetooth and a second communication chip 2508 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 2502, communication chip 2508, GPU 2514, cryptoprocessor 2542, DSP 2516, chipset 2520), and other components may include embodiments of the invention as described herein. In further embodiments, another component housed within the computing device 2500 may be formed in accordance with embodiments of the invention.

In various embodiments, the computing device 2500 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 2500 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In Example 1, an electronic device comprises a first metallization layer comprising a set of first conductive lines extending along a first direction on a first insulating layer on a substrate; a second metallization layer over the first metallization layer, the second metallization layer comprising a set of second conductive lines extending along a second direction to cross the set of first conductive lines to form a plurality of intersection regions, at least one of the intersection regions comprising a first portion of one of the first conductive lines and a second portion of one of the second conductive lines that crosses the first portion; and a plurality of preformed connections between the first metallization layer and the second metallization layer at the plurality of intersection regions, at least one of the preformed connections comprising a second insulating layer aligned to the second portion and the first portion.

In Example 2, the subject matter of Example 1 can optionally include that the second insulating layer is etch selective to the first insulating layer.

In Example 3, the subject matter of any of Examples 1-2 can optionally include a conductive via that is formed at a location defined by one of the preformed connections.

In Example 4, the subject matter of any of Examples 1-3 can optionally include that the first conductive lines and second conductive lines are substantially orthogonal to each other.

In Example 5, the subject matter of any of Examples 1-4 can optionally include that at least one of the preformed connections is substantially orthogonal to at least one of the first conductive lines and the second conductive lines.

In Example 6, the subject matter of any of Examples 1-5 can optionally include a line termination region on a portion of the first insulating layer aligned to the at least one of the preformed connections.

In Example 7, the subject matter of any of Examples 1-6 can optionally include that the line termination region comprises a third insulating layer that is etch selective to the first insulating layer.

In Example 8, a data processing system comprises a chip including an electronic device comprising a first metallization layer comprising a set of first conductive lines extending along a first direction on a first insulating layer on a substrate; a second metallization layer on the first metallization layer, the second metallization layer comprising a set of second conductive lines extending along a second direction to cross the set of first conductive lines at a plurality of intersection regions, at least one of the intersection regions comprising a first portion of one of the first conductive lines and a second portion of one of the second conductive lines that crosses the first portion; and a plurality of preformed connections between the first metallization layer and the second metallization layer at the plurality of intersection regions, at least one of the preformed connections comprising a second insulating layer aligned to the second portion and the first portion.

In Example 9, the subject matter of Example 8 can optionally include that the second insulating layer is etch selective to the first insulating layer.

In Example 10, the subject matter of any of Examples 8-9 can optionally include a conductive via that is formed at a location defined by one of the preformed connections.

In Example 11, the subject matter of any of Examples 8-10 can optionally include that the first conductive lines and second conductive lines are substantially orthogonal to each other.

In Example 12, the subject matter of any of Examples 8-11 can optionally include that at least one of the preformed connections is substantially orthogonal to at least one of the first conductive lines and the second conductive lines.

In Example 13, the subject matter of any of Examples 8-12 can optionally include that a line termination region on a portion of the first insulating layer is aligned to the at least one of the preformed connections.

In Example 14, the subject matter of any of Examples 8-13 can optionally include that the line termination region comprises a third insulating layer that is etch selective to the first insulating layer.

In Example 15, a method to provide an integrated circuit device comprises forming a first metallization layer comprising a set of first conductive lines extending along a first direction on a first insulating layer on a substrate; forming a second metallization layer over the first metallization layer, the second metallization layer comprising a set of second conductive lines extending along a second direction to cross the set of first conductive lines to form a plurality of intersection regions, at least one of the intersection regions comprising a first portion of one of the first conductive lines and a second portion of one of the second conductive lines that crosses the first portion and forming a plurality of preformed connections between the first metallization layer and the second metallization layer at the plurality of intersection regions, at least one of the preformed connections comprising a second insulating layer aligned to the second portion and the first portion.

In Example 16, the subject matter of Example 15 can optionally include depositing a mask layer on the plurality of preformed connections; and removing at least one of the preformed connections through the mask layer to form an opening to expose a portion of one of the first conductive lines; and depositing a conductive layer through the opening on the portion of one of the first conductive lines.

In Example 17, the subject matter of any of Examples 15-16 can optionally include depositing the second insulating layer on the first conductive lines; forming a grating layer on the second insulating layer, the grating layer comprising a plurality of grating lines that extend along the second direction; and removing portions of the second insulating layer using the grating layer as a mask to expose portions of the first conductive lines;

In Example 18, the subject matter of any of Examples 15-17 can optionally include depositing a third insulating layer on the exposed portions of the first conductive lines; removing the grating layer to expose portions of the second insulating layer, depositing a mask layer on the exposed portions of the second insulating layer; and removing at least one of the exposed portions of the second insulating layer.

In Example 19, the subject matter of any of Examples 15-18 can optionally include that the second insulating layer is etch selective to the first insulating layer.

In Example 20, the subject matter of any of Examples 15-19 can optionally include forming a line termination region for at least one of the second conductive lines, the line termination region comprising a third insulating layer that is etch selective to the first insulating layer.

In Example 21, a method to fabricate an electronic device comprises forming a first metallization layer comprising a set of first conductive lines on a first insulating layer on a substrate; depositing a second insulating layer on the first conductive lines; forming a grating layer comprising a plurality of grating lines on first portions of the second insulating layer; and removing second portions of the second insulating layer using the plurality of grating lines as a mask to expose portions of the first conductive lines.

In Example 22, the subject matter of Example 21 can optionally include that the grating lines are substantially perpendicular to the first conductive lines.

In Example 23, the subject matter of any of Examples 21-22 can optionally include removing the grating lines to expose the first portions of the second insulating layer; depositing a mask layer on the first portions of the second insulating layer; removing at least one of the first portions of the second insulating layer through the mask layer to form at least one opening to expose a portion of at least one of the first conductive layers; and depositing a conductive layer through the opening onto the portion to form a second metallization layer.

In Example 24, the subject matter of any of Examples 21-23 can optionally include that the second insulating layer is etch selective to the first insulating layer.

In Example 25, the subject matter of any of Examples 21-24 can optionally include that the second portions of the second insulating layer are removed using an isotropic etching.

In Example 26, the subject matter of any of Examples 21-25 can optionally include that the grating layer is etch selective to the second insulating layer and the first insulating layer.

In Example 27, the subject matter of any of Examples 21-26 can optionally include recessing the first conductive lines to form trenches, wherein the second insulating layer is deposited into the trenches.

In Example 28, the subject matter of any of Examples 21-27 can optionally include depositing a line termination region layer on portions of the first insulating layer.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a first metallization layer comprising a set of first conductive lines extending along a first direction on a first insulating layer on a substrate;
   a second metallization layer over the first metallization layer, the second metallization layer comprising a set of second conductive lines extending along a second direction to cross the set of first conductive lines to form a plurality of intersection regions, one of the intersection regions comprising a first portion of one of the first conductive lines and a second portion of one of the second conductive lines that crosses the first portion; and
   a plurality of preformed connections between the first metallization layer and the second metallization layer at the plurality of intersection regions, one of the preformed connections comprising a second insulating layer, the second insulating layer aligned to the second portion of the one of the second conductive lines and the first portion of the one of the first conductive lines.

2. The electronic device of claim 1, wherein the second insulating layer is etch selective to the first insulating layer.

3. The electronic device of claim 1, further comprising a conductive via that is formed at a location defined by the one of the preformed connections.

4. The electronic device of claim 1, wherein one of the preformed connections is between one of the first conductive lines and the second conductive lines.

5. The electronic device of claim 1, further comprising a line termination region on a portion of the first insulating layer aligned to the one of the preformed connections.

6. A data processing system comprising:
   a chip including
   an electronic device comprising
      a first metallization layer comprising a set of first conductive lines extending along a first direction on a first insulating layer on a substrate;
      a second metallization layer on the first metallization layer, the second metallization layer comprising a set of second conductive lines extending along a second direction to cross the set of first conductive lines at a plurality of intersection regions, one of the intersection regions comprising a first portion of one of the first conductive lines and a second portion of one of the second conductive lines that crosses the first portion; and
      a plurality of preformed connections between the first metallization layer and the second metallization layer at the plurality of intersection regions, one of the preformed connections comprising a second insulating layer, the second insulating layer aligned to the second portion of the one of the second conductive lines and the first portion of the one of the first conductive lines.

7. The data processing system of claim 6, wherein the second insulating layer is etch selective to the first insulating layer.

8. The data processing system of claim 6, further comprising a conductive via that is formed at a location defined by the one of the preformed connections.

9. The data processing system of claim 6, wherein one of the preformed connections is between one of the first conductive lines and the second conductive lines.

10. The data processing system of claim 6, further comprising a line termination region on a portion of the first insulating layer aligned to the one of the preformed connections.

11. A method to provide an integrated circuit device comprising:
    forming a first metallization layer comprising a set of first conductive lines extending along a first direction on a first insulating layer on a substrate;
    forming a second metallization layer over the first metallization layer, the second metallization layer comprising a set of second conductive lines extending along a second direction to cross the set of first conductive lines to form a plurality of intersection regions, one of the intersection regions comprising a first portion of one of the first conductive lines and a second portion of one of the second conductive lines that crosses the first portion and forming a plurality of connections between the first metallization layer and the second metallization layer at the plurality of intersection regions, one of the connections comprising a second insulating layer, the second insulating layer aligned to the second portion of the one of the second conductive lines and the first portion of the one of the first conductive lines.

12. The method of claim 11, further comprising:

depositing a mask layer on the plurality of connections; and forming an opening in the mask layer; and removing one of the connections through the opening in the mask layer to expose a portion of one of the first conductive lines; and depositing a conductive layer on the exposed portion of one of the first conductive lines.

13. The method of claim 11, further comprising:

depositing the second insulating layer on the first conductive lines;

forming a grating layer on the second insulating layer, the grating layer comprising a plurality of grating lines that extend along the second direction; and removing portions of the second insulating layer using the grating layer as a mask to expose portions of the first conductive lines.

14. The method of claim 11, wherein the second insulating layer is etch selective to the first insulating layer.

15. The method of claim 11, further comprising forming a line termination region for one of the second conductive lines, the line termination region comprising a third insulating layer that is etch selective to the first insulating layer.

16. A method to fabricate an electronic device comprising:

forming a first metallization layer comprising a set of first conductive lines on a first insulating layer on a substrate;

depositing a second insulating layer on the first conductive lines;

forming a grating layer comprising a plurality of grating lines on first portions of the second insulating layer; and removing second portions of the second insulating layer using the plurality of grating lines as a mask to expose portions of the first conductive lines.

17. The method of claim 16, further comprising:

removing the grating lines to expose the first portions of the second insulating layer;

depositing a mask layer on the first portions of the second insulating layer;

forming an opening in the mask layer;

removing one of the first portions of the second insulating layer through the opening in the mask layer to expose a portion of one of the first conductive layers; and depositing a conductive layer onto the exposed portion of the one of the conductive layers to form a second metallization layer.

18. The method of claim 16, wherein the second insulating layer is etch selective to the first insulating layer.

19. The method of claim 16, further comprising, subsequent to forming the set of first conductive lines, recessing the first conductive lines to form trenches, wherein the second insulating layer is deposited into the trenches.

20. The method of claim 16, further comprising depositing a line termination region layer on portions of the first insulating layer.

* * * * *